(12) United States Patent
Bin et al.

(10) Patent No.: US 11,729,979 B2
(45) Date of Patent: Aug. 15, 2023

(54) MEMORY DEVICE AND METHOD FOR FABRICATING THE MEMORY DEVICE

(71) Applicant: SK hynix Inc., Icheon-si (KR)

(72) Inventors: Jin-Ho Bin, Hanam-si (KR); Il-Young Kwon, Seoul (KR); Tae-Hong Gwon, Icheon-si (KR); Hye-Hyeon Byeon, Pohang-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/535,244

(22) Filed: Nov. 24, 2021

(65) Prior Publication Data

US 2022/0085069 A1    Mar. 17, 2022

Related U.S. Application Data

(63) Continuation of application No. 16/710,916, filed on Dec. 11, 2019, now Pat. No. 11,217,602.

(30) Foreign Application Priority Data

Jun. 10, 2019   (KR) .......................... 10-2019-0068038

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC .......... H01L 27/11582; H01L 27/1157; H01L 27/11556; H01L 27/11519;
(Continued)

(56) References Cited

U.S. PATENT DOCUMENTS 9,275,909 B2 *   3/2016   Jayanti ............... H01L 29/7889
9,484,357 B2 *  11/2016   Makala ............. H01L 29/40117
(Continued)

FOREIGN PATENT DOCUMENTS

CN       102263065 A    11/2011
CN       104541370 A     4/2015
(Continued)

*Primary Examiner* — Allison Bernstein
(74) *Attorney, Agent, or Firm* — William Park & Associates Ltd.

(57) ABSTRACT

Disclosed is a memory device and a method for fabricating the same, and the method may include forming an alternating stack in which dielectric layers and sacrificial layers are alternately stacked over a substrate, each of the sacrificial layers being a combination of porous and non-porous materials, forming a vertical opening penetrating the alternating stack, converting exposed surfaces of the sacrificial layers located on a side wall of the vertical opening into blocking layers through an oxidation process, forming a vertical channel structure contacting the blocking layers in the vertical opening, and replacing non-converting portions of the sacrificial layers with conductive layers, wherein each of the conductive layers comprises a round-like edge contacting each of the blocking layers.

7 Claims, 23 Drawing Sheets

(51) Int. Cl.
*H10B 41/27* (2023.01)
*H10B 41/35* (2023.01)
*H10B 43/10* (2023.01)
*H10B 43/35* (2023.01)

(58) Field of Classification Search
CPC ......... H01L 27/11524; H01L 27/11565; H01L 27/11573; H01L 29/792; H10B 43/27; H10B 41/10; H10B 41/27; H10B 41/35; H10B 43/10; H10B 43/35; H10B 43/40
See application file for complete search history.

(56) References Cited

U.S. PATENT DOCUMENTS

| | | | |
|---|---|---|---|
| 9,666,525 B2 | 5/2017 | Kim et al. | |
| 9,859,298 B1 | 1/2018 | Pang et al. | |
| 9,960,180 B1 | 5/2018 | Zhou et al. | |
| 2013/0134493 A1 | 5/2013 | Eom et al. | |
| 2016/0093635 A1 | 3/2016 | Rabkin et al. | |
| 2017/0018563 A1 | 1/2017 | Nishida | |
| 2018/0240810 A1* | 8/2018 | Tsuda | H01L 27/1157 |
| 2020/0168629 A1 | 5/2020 | Kang | |

FOREIGN PATENT DOCUMENTS

| | | |
|---|---|---|
| CN | 105470260 A | 4/2016 |
| CN | 109155313 A | 1/2019 |
| CN | 109216365 A | 1/2019 |
| JP | 2011249803 A | 12/2011 |
| TW | I647822 B | 1/2019 |

\* cited by examiner

MEMORY DEVICE AND METHOD FOR FABRICATING THE MEMORY DEVICE

CROSS-REFERENCE TO RELATED APPLICATIONS

The present application is a continuation application of U.S. patent application Ser. No. 16/710,916, filed on Dec. 11, 2019, and claims priority to Korean Patent Application No. 10-2019-0068038, filed on Jun. 10, 2019, which is incorporated herein by reference in its entirety.

BACKGROUND

1. Technical Field

Examples of embodiments generally relate to a method for fabricating a semiconductor device, and more particularly, to a memory device and a method for fabricating the memory device.

2. Related Art

A semiconductor device may include a memory device capable of storing data. The memory device may include memory cells. The memory cells may be arranged in three dimensions.

Various technology developments are required to improve the operational characteristics of the memory cells.

SUMMARY

In accordance with an embodiment, a method for fabricating a memory device may include: forming an alternating stack in which dielectric layers and sacrificial layers are alternately stacked over a substrate, each of the sacrificial layers being a combination of porous and non-porous materials; forming a vertical opening penetrating the alternating stack; converting exposed surfaces of the sacrificial layers located on a side wall of the vertical opening into blocking layers through an oxidation process; forming a vertical channel structure contacting the blocking layers in the vertical opening; and replacing non-converting portions of the sacrificial layers with conductive layers, wherein each of the conductive layers comprises a round-like edge contacting each of the blocking layers.

In accordance with an embodiment, a method for fabricating a memory device may include: forming an alternating stack in which dielectric layers and sacrificial layers are alternately stacked over a substrate, each of the sacrificial layers being a combination of porous and non-porous materials; forming a vertical opening penetrating the alternating stack; recessing vertical exposed surfaces of the sacrificial layers located on a side wall of the vertical opening to rounded exposed surfaces; forming blocking layers that cover the rounded exposed surfaces of the sacrificial layers; forming a vertical channel structure contacting the blocking layers in the vertical opening; and replacing the sacrificial layers with conductive layers, wherein each of the conductive layers comprises a round-like edge contacting each of the blocking layers.

In accordance with an embodiment, a memory device may include: an alternating stack of conductive layers and dielectric layers located over a substrate; a vertical channel structure that penetrates the alternating stack; a covering blocking layer that surrounds an outer wall of the vertical channel structure; and a protruding blocking layer that extends from the covering blocking layer and contacts edges of the conductive layers, wherein each of the conductive layers comprises a round-like edge contacting the protruding blocking layer.

DETAILED DESCRIPTION

Various examples and embodiments described herein will be described with reference to cross-sectional views, plan views and block diagrams, which are ideal schematic views of the present application. Thus, the shape of the illustrations may be modified by fabricating techniques and/or tolerances. Accordingly, the embodiments are not limited to the specific forms shown, but also include changes in the shapes that are generated according to the fabricating process. The regions illustrated in the figures have schematic attributes, and the shapes of the regions illustrated in the figures are intended to illustrate specific types of regions of the elements and are not intended to limit the scope.

Figure 1A:
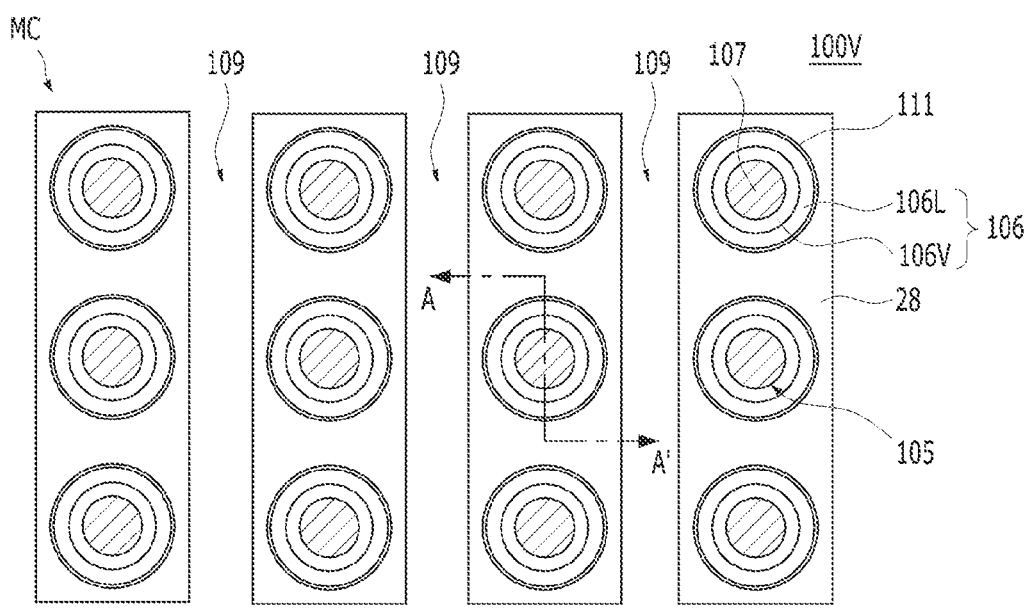
FIG. 1A is a diagram illustrating a vertical memory device in accordance with an embodiment.
Figure 1B:
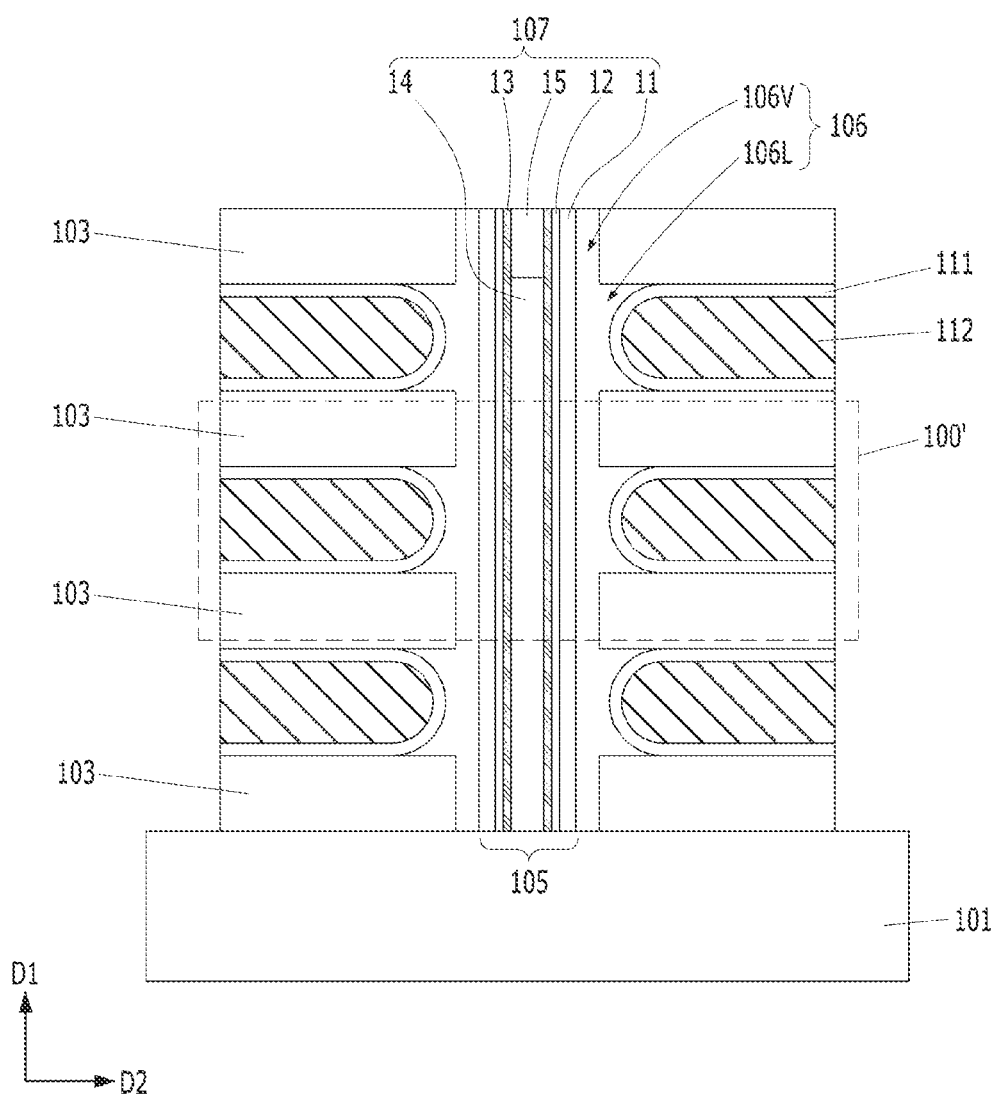
FIG. 1B is a cross-sectional view illustrating the vertical memory device taken along an A-A' line illustrated in FIG. 1A.

FIG. 1A is a diagram illustrating a vertical memory device 100V in accordance with an embodiment. FIG. 1B is a cross-sectional view illustrating the vertical memory device 100V taken along an A-A' line illustrated in FIG. 1A.

Referring to FIGS. 1A and 1B, the vertical memory device 100V may include a vertical NAND. The vertical memory device 100V may include a three-dimensional (3D) NAND. The vertical memory device 100V may include a substrate 101 and an alternating stack MC. The alternating stack MC may be formed on the substrate 101. The vertical memory device 100V may further include a plurality of vertical channel structures 107 penetrating the alternating stack MC.

The alternating stack MC may have a structure in which a plurality of gate structures 112 and a plurality of dielectric layers 103 are alternately stacked. The gate structures 112 and the dielectric layers 103 may be alternately stacked in a first direction (reference numeral 'D1' of FIG. 1B) perpendicular to the surface of the substrate 101. The vertical channel structures 107 may penetrate the alternating stack MC.

The vertical channel structures 107 may extend vertically on the substrate 101. The vertical channel structures 107 may be formed in vertical channel holes 105 penetrating the alternating stack MC. Each of the vertical channel structures 107 may include a memory stack and a channel layer 13. The memory stack may have a shape of surrounding the channel layer 13. The memory stack may include a charge storage layer 11 and a tunnel dielectric layer 12. The tunnel dielectric layer 12 may have a shape of surrounding the outer wall of the channel layer 13. The charge storage layer 11 may have a shape of surrounding the outer wall of the tunnel dielectric layer 12. The vertical channel structure 107 may further include a core dielectric layer 14 and a conductive pad 15. The core dielectric layer 14 may be formed in the channel layer 13, and the conductive pad 15 may be formed on the core dielectric layer 14. The channel layer 13 may include a semiconductor material. For example, the channel layer 13 may include any one of a polycrystalline semiconductor material, an amorphous semiconductor material and a monocrystalline semiconductor material. The channel layer 13 may include silicon (Si), germanium (Ge), silicon germanium (SiGe), an III/V-group compound or an II/VI-group compound. The channel layer 13 may include polysilicon. The tunnel dielectric layer 12 may include silicon oxide, and the charge storage layer 11 may include silicon nitride. The inner space of the channel layer 13 may be fully filled with the core dielectric layer 14. The core dielectric layer 14 may include silicon oxide or silicon nitride. The conductive pad 15 may be formed on the core dielectric layer 14. The inner space of the channel layer 13 may be filled with the core dielectric layer 14 and the conductive pad 15. The conductive pad 15 may include polysilicon doped with an impurity. The conductive pad 15 may be electrically coupled to the channel layer 13.

A blocking layer 106 may have a shape of surrounding the outer wall of the vertical channel structure 107, for example, the outer wall of the charge storage layer 11. The vertical channel structure 107 may contact the blocking layer 106 while being formed in each of the vertical channel holes 105.

Each of the gate structures 112 may have a shape of surrounding the side wall of the vertical channel structure 107. The gate structure 112 may be located between the plurality of dielectric layers 103. The gate structure 112 may extend in a second direction (reference numeral 'D2' of FIG. 1B) parallel to the surface of the substrate 101. A liner blocking layer 111 may be formed between the gate structure 112 and the blocking layer 106. The liner blocking layer 111 may be conformally formed. The liner blocking layer 111 may be a material that is different from the blocking layer 106. The liner blocking layer 111 may include aluminum oxide. The liner blocking layer 111 may have a shape of surrounding the blocking layer 106 and the vertical channel structure 107.

The gate structure 112 may include a metal-based material. The gate structure 112 may include a stack of a barrier layer and a low-resistance metal layer, for example, a stack of titanium nitride and tungsten.

The neighboring alternating stacks MC may be separated from each other by an isolation recess 109. The isolation recess 109 may have a trench shape. The isolation recess 109 may be referred to as a "slit". The neighboring gate structures 112 may be separated in units of blocks by the isolation recesses 109. One block may include the one gate structure 112 and the plurality of vertical channel structures 107. In one block, the plurality of vertical channel structures 107 may share the one gate structure 112. From a top view, the plurality of vertical channel structures 107 may be regularly arrayed. Although it is illustrated in the present embodiment for convenience in description that three vertical channel structures 107 are included in one block, the array of vertical channel structures 107 may be set in various manners.

Figure 1C:
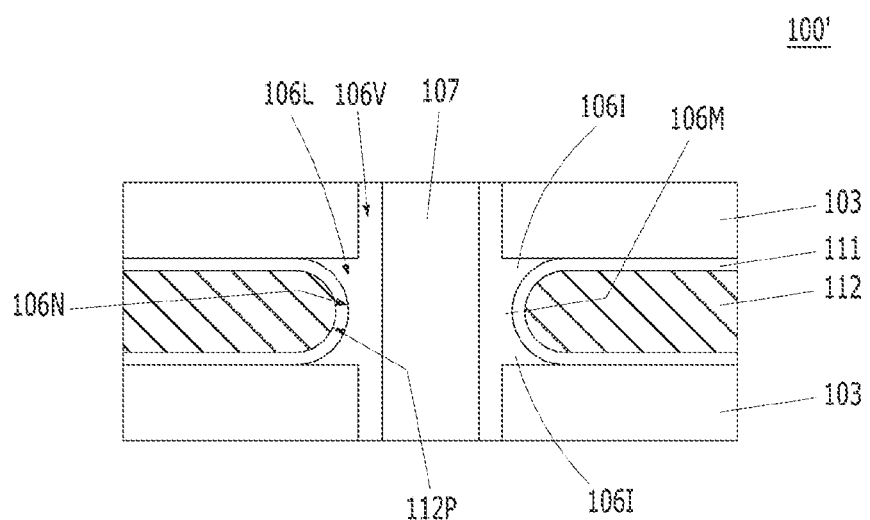
FIG. 1C is an enlarged view illustrating reference numeral 100' illustrated in FIG. 1B.

FIG. 1C is an enlarged view illustrating reference numeral 100' illustrated in FIG. 1B.

Referring to FIG. 1C, the blocking layer 106 may include a covering blocking layer 106V and a protruding blocking layer 106L. The protruding blocking layer 106L may extend from the covering blocking layer 106V.

The protruding blocking layer 106L may include interface portions 106I and a middle portion 106M between the interface portions 106I. The interface portions 106I may contact the dielectric layer 103. The interface portions 106I may have cusp shapes. The protruding blocking layer 106L may include silicon oxynitride. The covering blocking layer 106V may include silicon oxide.

The protruding blocking layer 106L may be non-conformally formed, and the covering blocking layer 106V may be conformally formed. The edge profile of the gate structure 112 may be modified by the protruding blocking layer 106L. The edge profile of the gate structure 112 may have a round-like profile.

The liner blocking layer 111 may be located between the protruding blocking layer 106L and a round-like edge of the gate structure 112.

The round-like edge of the gate structure 112 may have a positive profile 112P which is covered by the protruding blocking layer 106L. The surface of the protruding blocking layer 106L may have a round-like profile, and the rounded surface of the protruding blocking layer 106L may be adjacent to the round-like edge of the gate structure 112. The rounded surface of the protruding blocking layer 106L may have a negative profile 106N.

FIGS. 2A to 2H are diagrams for describing an example of a method for fabricating the vertical memory device 100V illustrated in FIGS. 1A to 1C.

Figure 2A:
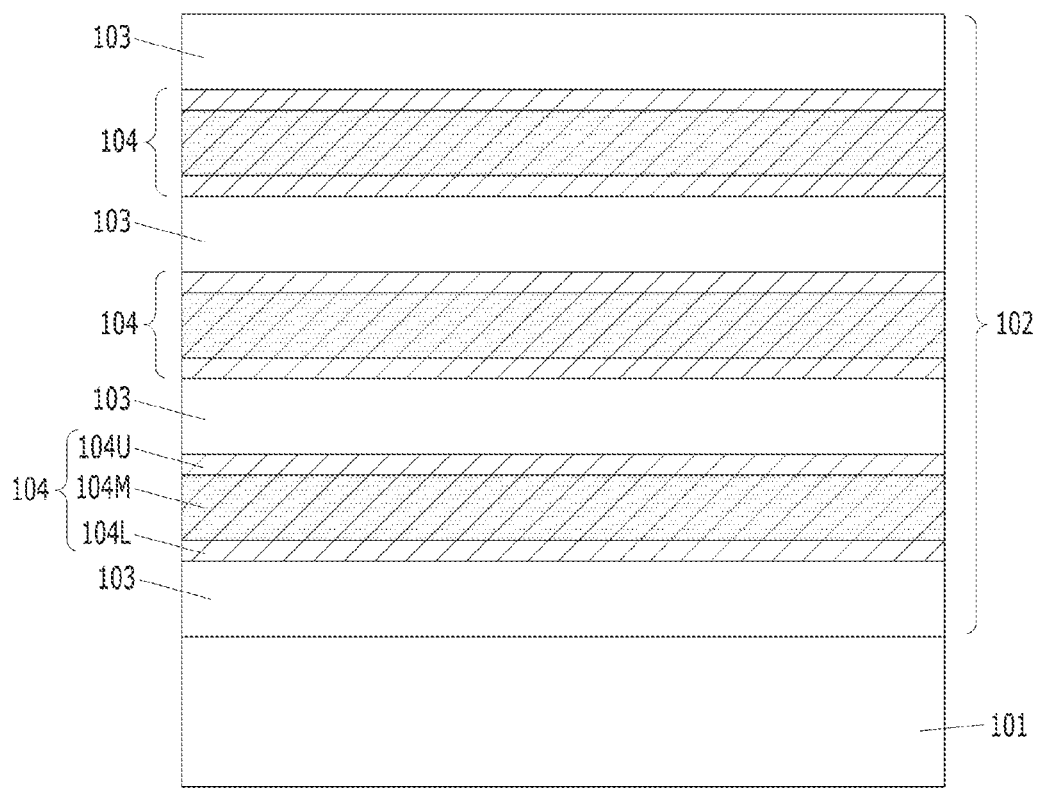
FIGS. 2A to 2H are diagrams for describing an example of a method for fabricating the vertical memory device illustrated in FIGS. 1A to 1C.

As illustrated in FIG. 2A, a stack structure 102 may be formed on the substrate 101. The substrate 101 may be a material suitable for semiconductor processing. The substrate 101 may include a semiconductor substrate. The substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 101 may include another semiconductor material, such as germanium. The substrate 101 may include an III/V-group semiconductor substrate, for example, a chemical compound semiconductor substrate such as a gallium arsenide (GaAs). The substrate 101 may include a Silicon-On-Insulator (SOI) substrate.

The stack structure 102 may include an alternating stack of the dielectric layer 103 and a sacrificial layer 104. For example, the alternating stack may have a structure in which the dielectric layer 103 and the sacrificial layer 104 are alternately stacked. Each of the dielectric layer 103 and the sacrificial layer 104 may be formed of a plurality of layers. Although it is described in an embodiment for convenience in description that four dielectric layers 103 and three sacrificial layers 104 are alternately stacked, the number of stacks of the dielectric layer 103 and the sacrificial layer 104 may be set in various manners. The dielectric layer 103 and the sacrificial layer 104 may be repeatedly stacked in a direction perpendicular to the surface of the substrate 101.

The dielectric layer 103 may include a material having an etch selectivity to the sacrificial layer 104. The dielectric layer 103 may include silicon oxide, and the sacrificial layer 104 may include silicon nitride.

The sacrificial layer 104 may include a combination of porous and non-porous materials. For example, the sacrificial layer 104 may have a multilayered structure including a first porous layer 104L, a non-porous layer 104M and a second porous layer 104U. The first and second porous layers 104L and 104U may be the same material. The non-porous layer 104M may be a different material from the first and second porous layers 104L and 104U. The non-porous layer 104M may have a larger thickness than the first and second porous layers 104L and 104U. The first and second porous layers 104L and 104U may include a porous material, and the non-porous layer 104M may include a non-porous material.

The first and second porous layers 104L and 104U may include a material having a higher oxidation rate than the non-porous layer 104M.

The first porous layer 104L, the second porous layer 104U and the non-porous layer 104M may be nitride-based materials. The first and second porous layers 104L and 104U may be a porous nitride, and the non-porous layer 104M may be a non-porous nitride. In an embodiment, the first and second porous layers 104L and 104U may be porous silicon nitride, and the non-porous layer 104M may be non-porous silicon nitride. Each of the first and second porous layers 104L and 104U may directly contact the dielectric layer 103, and the non-porous layer 104M might not contact the dielectric layer 103.

Figure 2B:
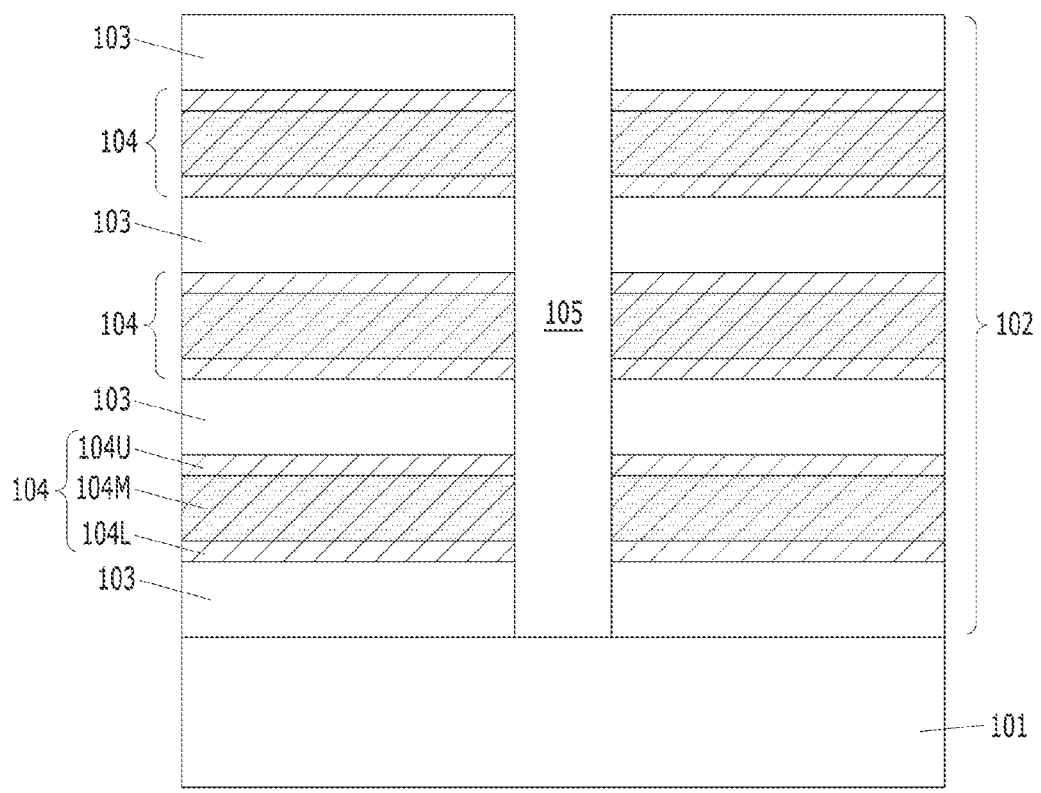

As illustrated in FIG. 2B, the vertical channel hole 105 may be formed in the stack structure 102. From a top view, the vertical channel hole 105 may have a hole shape. A part of the stack structure 102 may be etched to form the vertical channel hole 105. The vertical channel hole 105 may expose a part of the surface of the substrate 101.

The dielectric layer 103 and the sacrificial layer 104 may be sequentially etched anisotropically to form the vertical channel hole 105. The vertical channel hole 105 may be formed in a direction perpendicular to the surface of the substrate 101.

Although not illustrated, from a plan view, the vertical channel hole 105 may be formed in plural, and have a hole array structure. When the vertical channel hole 105 is formed, the surface of the substrate 101 may be over-etched.

The side wall of the vertical channel hole 105 may be provided by a plurality of dielectric layers 103 and a plurality of sacrificial layers 104. A part of the side wall of the vertical channel hole 105 may be provided by the first porous layer 104L, the second porous layer 104U and the non-porous layer 104M. In other words, parts of the first porous layer 104L, the second porous layer 104U and the non-porous layer 104M may be exposed by the vertical channel hole 105.

Figure 2C:
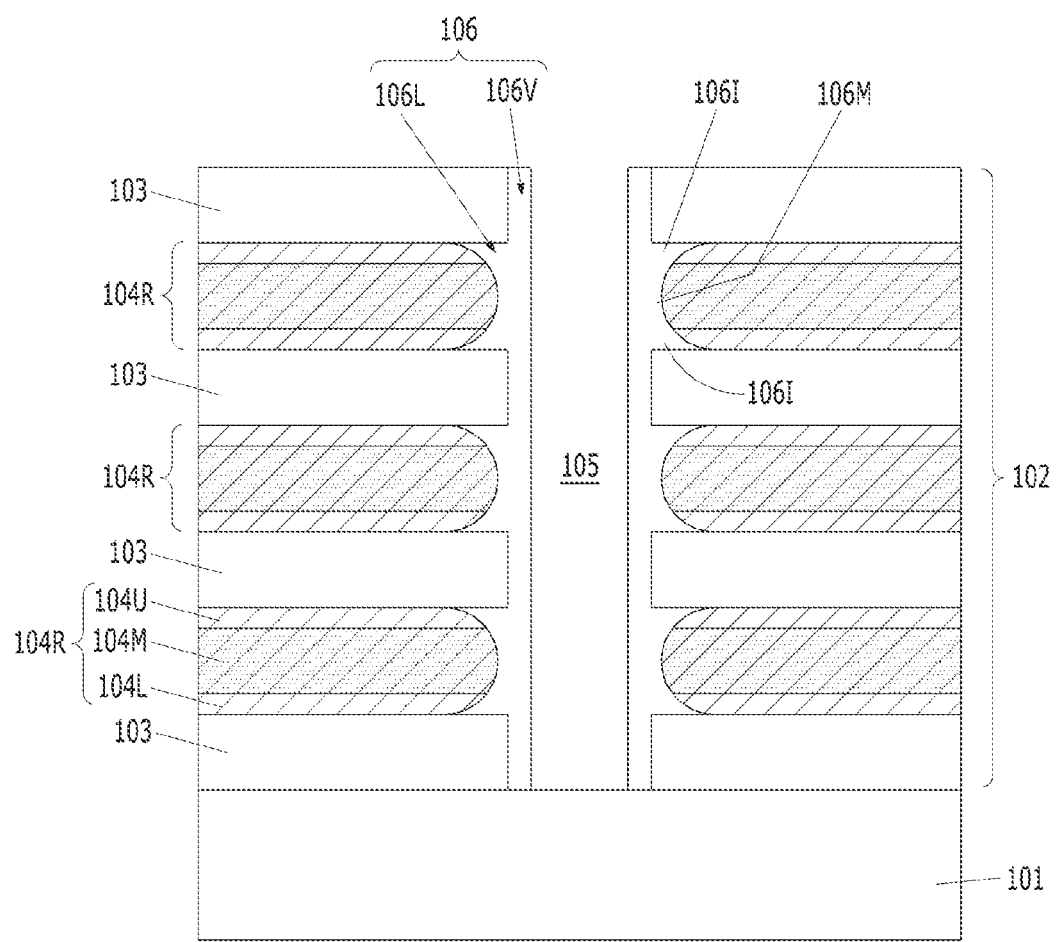

As illustrated in FIG. 2C, the blocking layer 106 may be formed. An oxidation process may be performed to form the blocking layer 106. The side wall of the vertical channel hole 105 may be converted into the blocking layer 106 by the oxidation process. Exposed surfaces of the sacrificial layer 104 located on the side wall of the vertical channel hole 105 may be oxidized by the oxidation process. The oxidation process may include a thermal oxidation process, a radical oxidation process, a plasma oxidation process or an In-Situ Steam Generation (ISSG) oxidation process. After forming the blocking layer 106, a non-converted residual sacrificial layer may remain between the dielectric layers 103 as indicated by reference numeral 104R.

The blocking layer 106 may include the covering blocking layer 106V and the protruding blocking layer 106L. The covering blocking layer 106V may be formed by oxidizing exposed surfaces of the dielectric layer 103. The protruding blocking layer 106L may be formed by laterally oxidizing exposed surfaces of the first porous layer 104L, the second porous layer 104U and the non-porous layer 104M. The covering blocking layer 106V may have a uniform thickness. The protruding blocking layer 106L may have a non-uniform thickness.

The blocking layer 106 may cover the side wall of the vertical channel hole 105. The protruding blocking layer 106L may extend horizontally from the covering blocking layer 106V.

The protruding blocking layer 106L may include the interface portions 106I and the middle portion 106M between the interface portions 106I. The interface portions 106I may be formed by edge oxidation of the first and second porous layers 104L and 104U. The middle portion 106M may be formed by edge oxidation of the non-porous layer 104M. The interface portions 106I may contact the dielectric layer 103.

During the oxidation process, the first and the second porous layers 104L and 104U may be oxidized faster than the non-porous layer 104M. Thus, the exposed surfaces of the first and second porous layers 104L and 104U may be oxidized rapidly while the exposed surface of the non-porous layer 104M is oxidized. When the first porous layer 104L, the non-porous layer 104M and the second porous layer 104U include silicon nitride, the protruding blocking layer 106L may include silicon oxynitride. The covering blocking layer 106V may include silicon oxide.

As described above, the protruding blocking layer 106L may be formed by the oxidation process, and be non-conformally formed. The edge profile of the sacrificial layer 104 may be modified by the protruding blocking layer 106L. The edge profile of the sacrificial layer 104 may have a round-like profile.

As the protruding blocking layer 106L is formed, the edge of a residual sacrificial layer 104R may have a round-like profile. The edge of the residual sacrificial layer 104R may have a positive profile that is covered by the protruding blocking layer 106L. The surface of the protruding blocking layer 106L may have a round-like profile, and the rounded surface of the protruding blocking layer 106L may contact the edge of the residual sacrificial layer 104R.

Figure 2D:
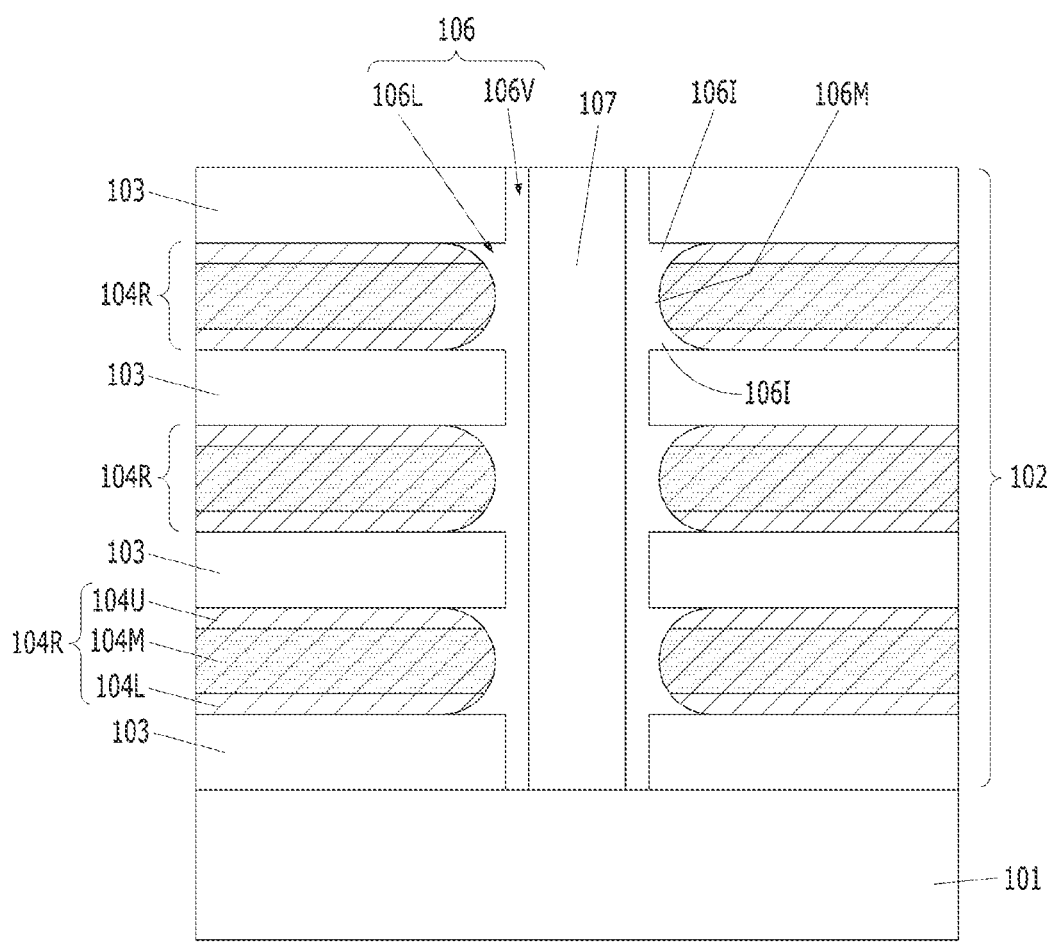

As illustrated in FIG. 2D, the vertical channel structure 107 may be formed. The vertical channel structure 107 may extend vertically from the surface of the substrate 101. The vertical channel structure 107 may fill the vertical channel hole 105. The vertical channel structure 107 may include a memory stack and a channel layer. The vertical channel structure 107 may correspond to the vertical channel structure 107 of FIG. 1B. The blocking layer 106 may have a shape of surrounding the outer wall of the vertical channel structure 107.

Referring back to FIG. 1B, the vertical channel structure 107 may include the memory stack and the channel layer 13. The memory stack may include the charge storage layer 11 and the tunnel dielectric layer 12. The tunnel dielectric layer 12 may have a shape of surrounding the outer wall of the channel layer 13. The charge storage layer 11 may have a shape of surrounding the outer wall of the tunnel dielectric layer 12. The blocking layer 106 may have a shape of surrounding the outer wall of the charge storage layer 11. is The vertical channel structure 107 may further include the core dielectric layer 14 and the conductive pad 15. The core dielectric layer 14 may be formed in the channel layer 13, and the conductive pad 15 may be formed on the core dielectric layer 14. The channel layer 13 may include a semiconductor material. For example, the channel layer 13 may include any one of a polycrystalline semiconductor material, an amorphous semiconductor material and a monocrystalline semiconductor material. The channel layer 13 may include silicon (Si), germanium (Ge), silicon germanium (SiGe), an III/V-group compound or an II/VI-group compound. The channel layer 13 may include polysilicon. The tunnel dielectric layer 12 may include silicon oxide, and the charge storage layer 11 may include silicon nitride. The inner space of the channel layer 13 may be fully filled with the core dielectric layer 14. The core dielectric layer 14 may include silicon oxide or silicon nitride. The conductive pad 15 may be formed on the core dielectric layer 14. The inner space of the channel layer 13 may be filled with the core dielectric layer 14 and the conductive pad 15. The conductive pad 15 may include polysilicon doped with an impurity. The conductive pad 15 may be electrically coupled to the channel layer 13.

Figure 2E:
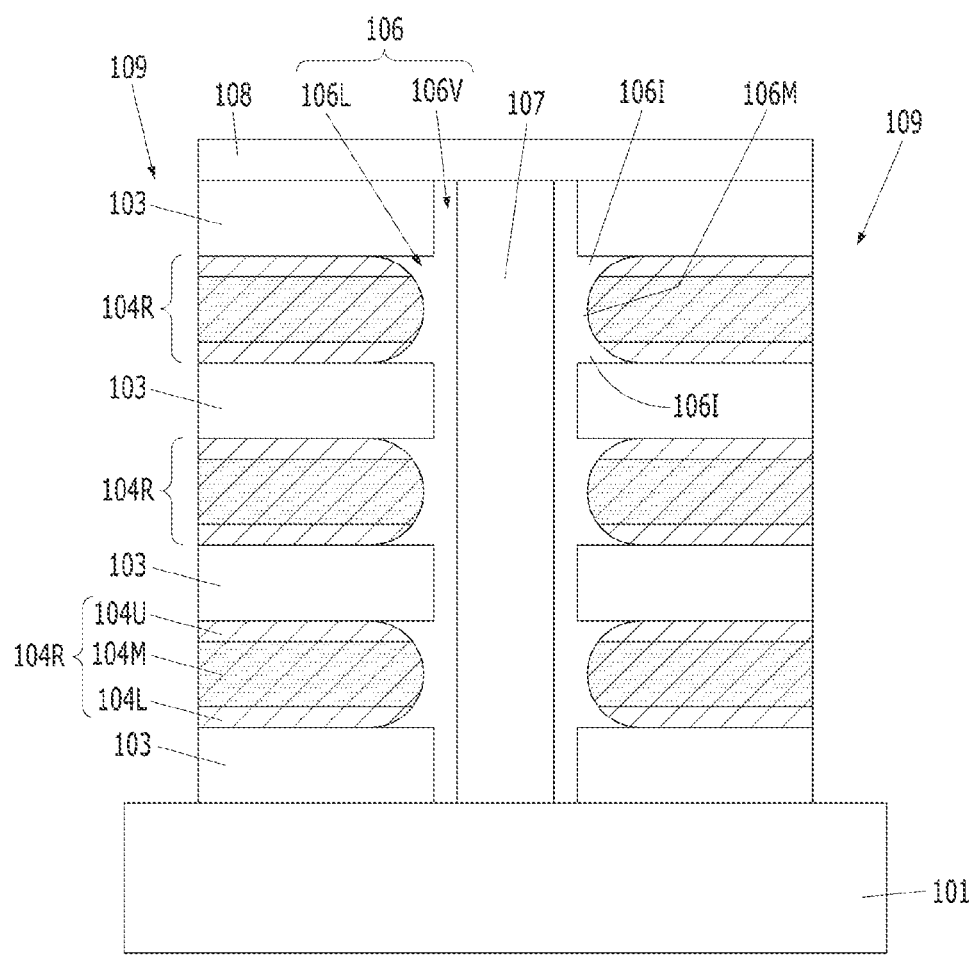

As illustrated in FIG. 2E, the isolation recess 109 may be formed. Another part of the stack structure 102 may be etched using a hard mask layer 108 in order to form the isolation recess 109. The isolation recess 109 may extend vertically from the surface of the substrate 101. From a top view, the isolation recess 109 may have a line shape. The isolation recess 109 may be referred to as a "slit" or a "trench".

Figure 2F:
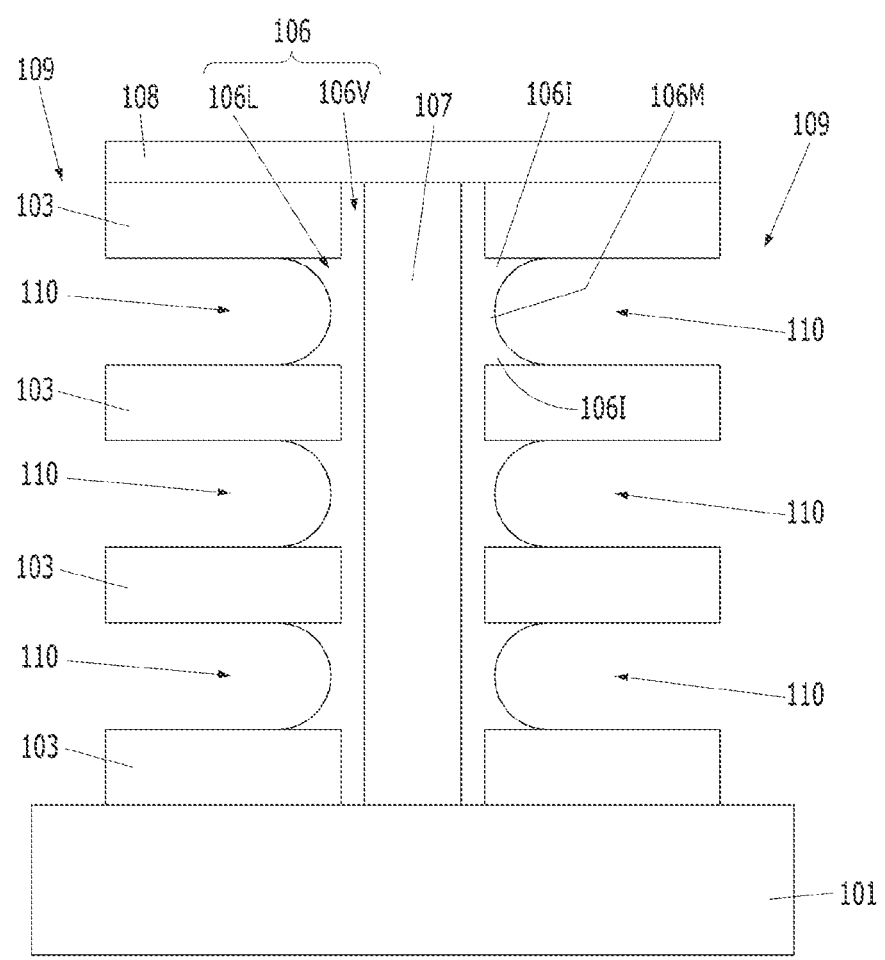

As illustrated in FIG. 2F, a horizontal recess 110 may be formed. The residual sacrificial layer 104R may be removed to form the horizontal recess 110. The residual sacrificial layer 104R may be removed by a wet etch process. Since the residual sacrificial layer 104R includes silicon nitride, the wet etch process may be performed using phosphoric acid. As the residual sacrificial layer 104R is removed, the horizontal recess 110 may be formed between the neighboring dielectric layers 103. The horizontal recess 110 may have a shape of surrounding the side walls of the vertical channel structure 107 and the protruding blocking layer 106L. One end of the horizontal recess 110 may expose the rounded surface of the protruding blocking layer 106L.

The horizontal recess 110 may extend in a direction parallel to the surface of the substrate 101. The horizontal recess 110 may have a high aspect ratio of height H to depth W of 1:5 or more. The horizontal recess 110 may have a high aspect ratio parallel to the surface of the substrate 101.

The inner edge profile of the horizontal recess 110 may have a round-like profile. The round-like profile may be provided by the surface of the protruding blocking layer 106L.

Figure 2G:
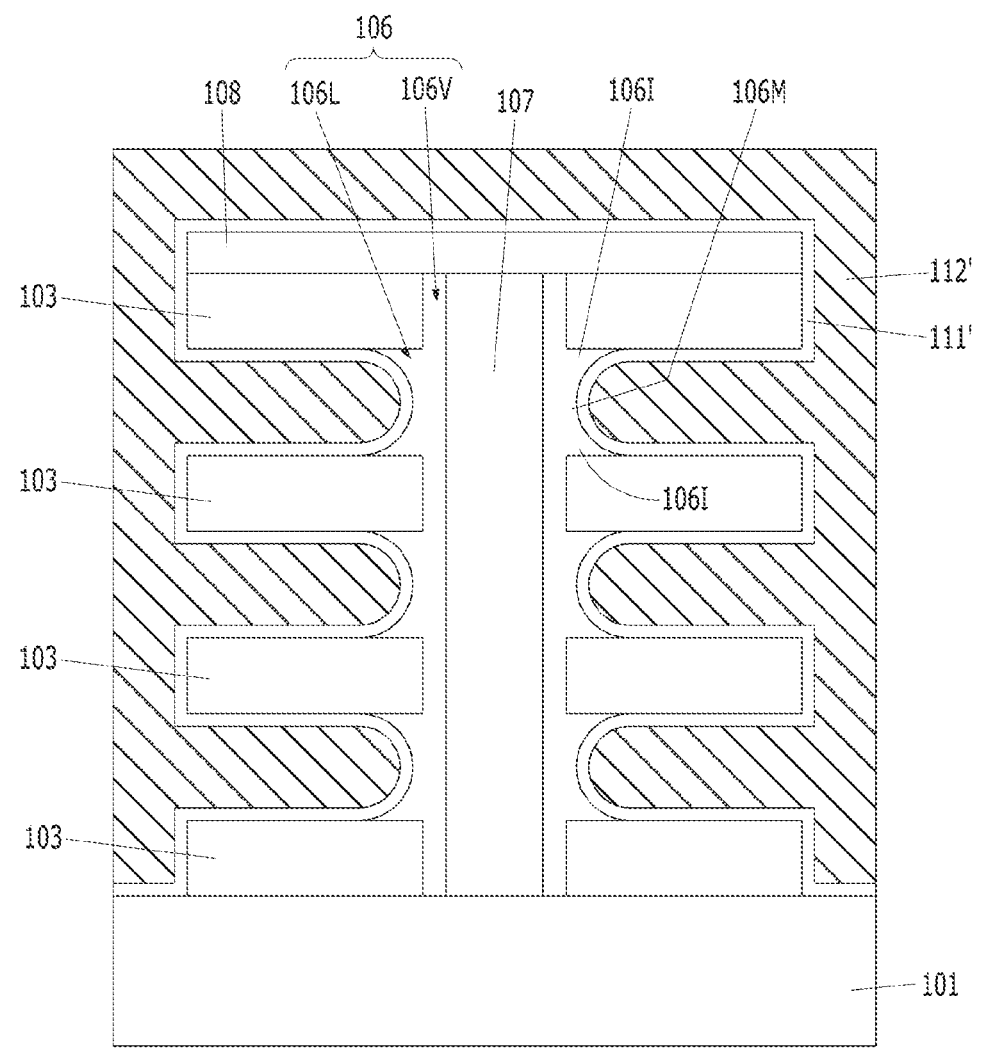

As illustrated in FIG. 2G, a liner layer 111' and a preliminary conductive layer 112' may be sequentially formed in the horizontal recess 110. For example, the liner layer 111' may be conformally formed along the profile of the horizontal recess 110, and subsequently, the preliminary conductive layer 112' may be formed on the liner layer 111'. The preliminary conductive layer 112' may fully fill the horizontal recess 110.

The liner layer 111' may include a blocking material. The liner layer 111' may include aluminum oxide. The liner layer 111' may be a different material from the blocking layer 106. The liner layer 111' may be formed by Atomic Layer Deposition (ALD).

The preliminary conductive layer 112' may gap-fill the horizontal recess 110. The preliminary conductive layer 112' may include a semiconductor material, a metal material or a combination thereof. The preliminary conductive layer 112' may include silicon, a metal, metal nitride, metal silicide or combinations thereof. The preliminary conductive layer 112' may be formed by Chemical Vapor Deposition (CVD) or ALD. The preliminary conductive layer 112' may include a tungsten layer. In order to deposit the tungsten layer, tungsten and a fluorine-containing gas may be used as a tungsten source gas, and a hydrogen-containing gas may be used as a reaction gas. The tungsten source gas may include tungsten hexafluoride ($WF_6$). The reaction gas may include $H_2$. During the deposition of the tungsten layer, argon (Ar) may be added other than the tungsten source gas and the reaction gas. In some embodiments, the is preliminary conductive layer 112' may be formed by stacking titanium nitride and tungsten.

As the preliminary conductive layer 112' is formed as described above, the horizontal recess 110 may be fully gap-filled with the liner layer 111' and the preliminary conductive layer 112'. The preliminary conductive layer 112' may be a stack of titanium nitride and tungsten (TiN/W).

In some embodiments, the liner layer 111' may be omitted, and thus the horizontal recess 110 may be fully gap-filled with the preliminary conductive layer 112'. In an embodiment, the horizontal recess 110 may be fully gap-filled with the preliminary conductive layer 112' and thus, the conductive layers include a round-like edge contacting each of the blocking layers. For example, the rounded surface of the blocking layer 106 is in contact with the round-like edge of the preliminary conductive layer 112'.

Figure 2H:
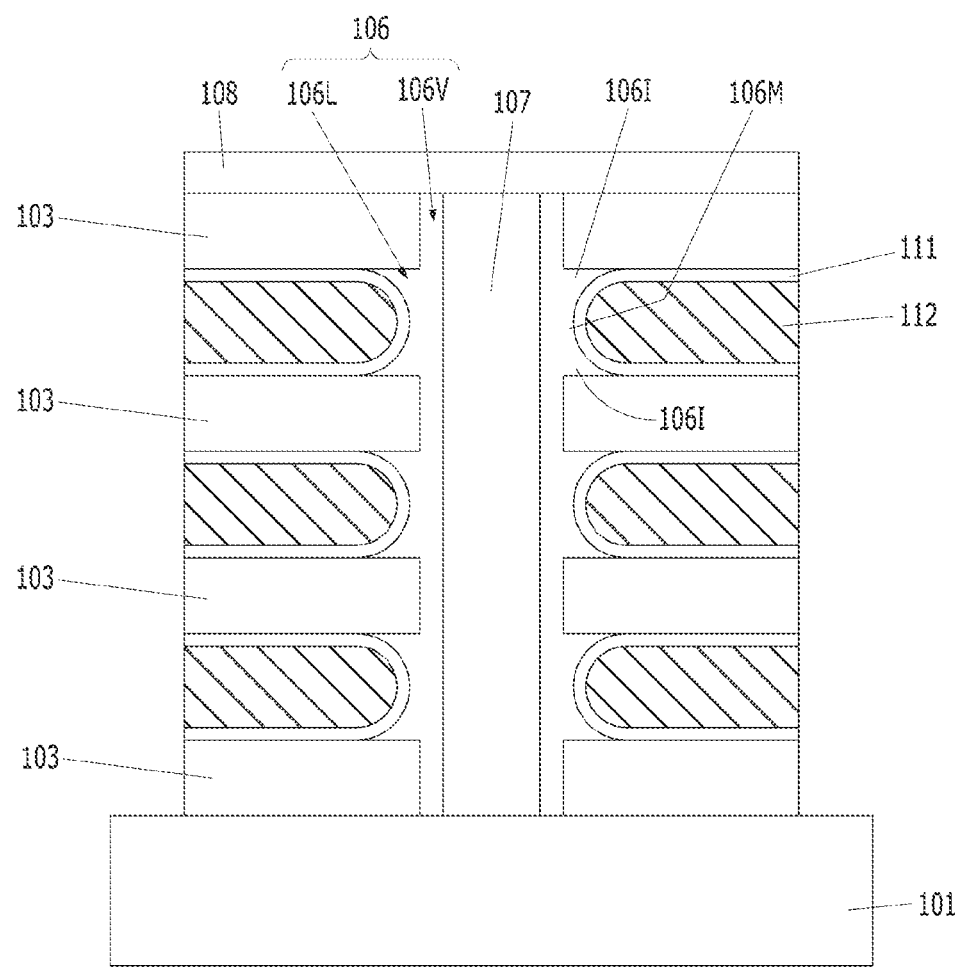

As illustrated in FIG. 2H, the liner layer 111' and the preliminary conductive layer 112' may be selectively separated. The liner layer 111' and the preliminary conductive layer 112' may be removed to expose the top surface of the hard mask layer 108. Through a process of selectively removing the liner layer 111' and the preliminary conductive layer 112', the liner blocking layer 111 and the gate structure 112 may be formed in the horizontal recess 110. Each of the liner blocking layer 111 and the gate structure 112 may have a shape of surrounding the side wall of the protruding blocking layer 106L. An etch-back process may be performed on the liner layer 111' and the preliminary conductive layer 112' to allow the liner blocking layer 111 and the gate structure 112 to remain in the horizontal recess 110.

The gate structure 112 may be formed without a void in the horizontal recess 110, and thus be formed without a defect due to fumes in the horizontal recess 110.

The edge of the gate structure 112 adjacent to the protruding blocking layer 106L may have a round-like profile. The round-like profile may be provided by the rounded surface of the protruding blocking layer 106L.

The rounded surface of the protruding blocking layer 106L may have a negative profile that covers a round-like edge of the gate structure 112. The round-like edge of the gate structure 112 may have a positive profile that extends to the rounded surface of the protruding blocking layer 106L.

Figure 3A:
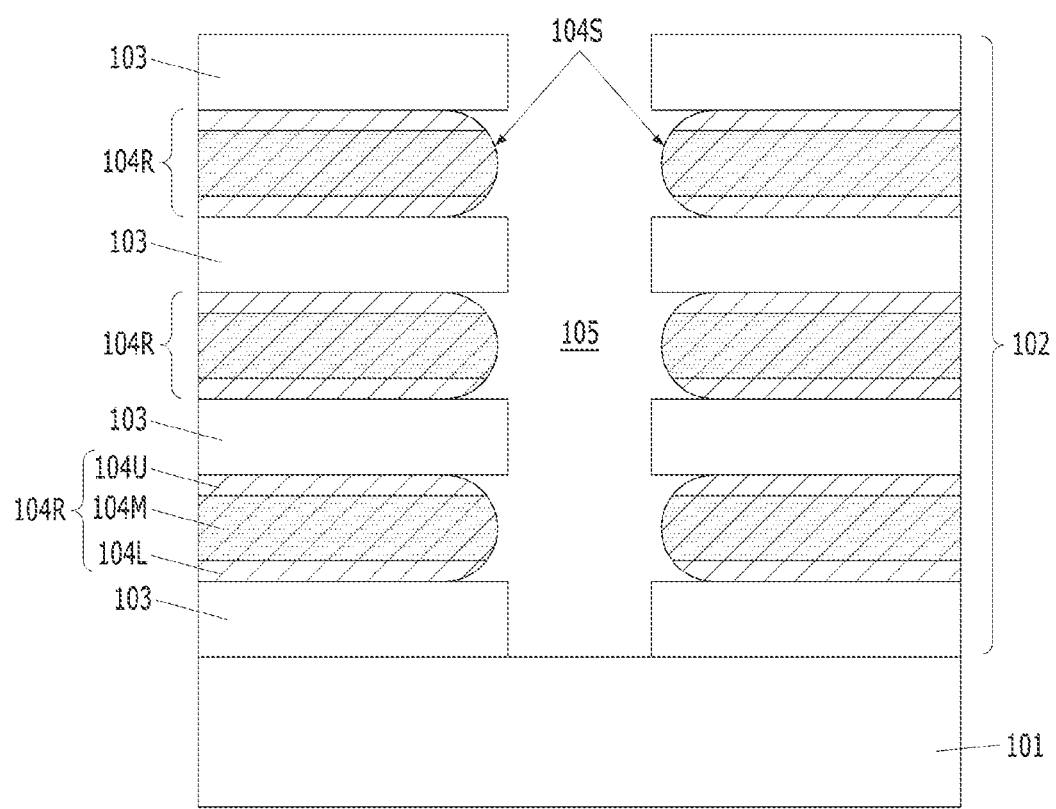
FIGS. 3A and 3B are diagrams for describing another example of a method for fabricating the vertical memory device illustrated in FIGS. 1A to 1C.
Figure 3B:
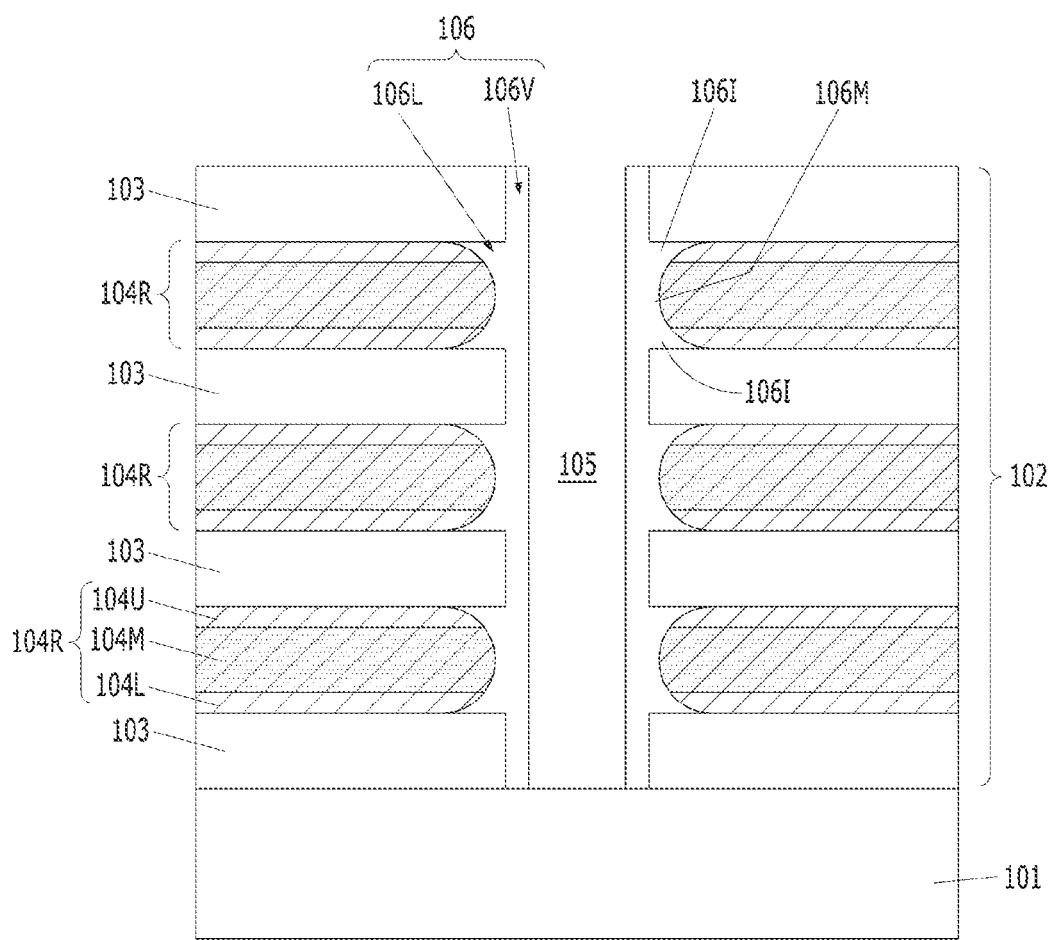

FIGS. 3A and 3B are diagrams for describing another example of a method for fabricating the vertical memory device 100V illustrated in FIGS. 1A to 1C. The method illustrated in FIGS. 3A and 3B may be similar to that illustrated in FIGS. 2A to 2H. Hereinafter, descriptions of overlapping configurations will be omitted.

As illustrated in FIG. 2A, the stack structure 102 may be formed on the substrate 101. The stack structure 102 may include an alternating stack of the dielectric layer 103 and a sacrificial layer 104. For example, the alternating stack may have a structure in which the dielectric layer 103 and the sacrificial layer 104 are alternately stacked. Each of the dielectric layer 103 and the sacrificial layer 104 may be formed of a plurality of layers.

The sacrificial layer 104 may include a combination of porous and non-porous materials. For example, the sacrificial layer 104 may be a multilayered structure including a first porous layer 104L, a non-porous layer 104M and a second porous layer 104U. The first and the second porous layers 104L and 104U may be the same material. The non-porous layer 104M may be a different material from the first and second porous layers 104L and 104U. The non-porous layer 104M may have a larger thickness than the first and second porous layers 104L and 104U. The first and second porous layers 104L and 104U may include a porous material, and the non-porous layer 104M may include a non-porous material.

The first and second porous layers 104L and 104U may include a material having a higher wet etch rate than the non-porous layer 104M.

The first porous layer 104L, the second porous layer 104U and the non-porous layer 104M may be nitride-based materials. The first and second porous layers 104L and 104U may be porous nitride, and the non-porous layer 104M may be non-porous nitride. Each of the first and second porous layers 104L and 104U may directly contact the dielectric layer 103, and the non-porous layer 104M might not contact the dielectric layer 103.

As illustrated in FIG. 2B, the vertical channel hole 105 may be formed in the stack structure 102. The side wall of the vertical channel hole 105 may be provided by the dielectric layer 103 and the sacrificial layer 104. A part of the side wall of the vertical channel hole 105 may be provided by the first porous layer 104L, the second porous layer 104U and the non-porous layer 104M. In other words, parts of the first porous layer 104L, the second porous layer 104U and the non-porous layer 104M may be exposed by the vertical channel hole 105.

Subsequently, as illustrated in FIG. 3A, a vertical exposed surface of the sacrificial layer 104 located on the side wall of the vertical channel hole 105 may be recessed to a round-like exposed surface 104S. Accordingly, the sacrificial layer 104 may have the round-like exposed surface 104S. For example, in an embodiment, the sacrificial layer 104 may have the rounded exposed surfaces 104S.

The sacrificial layer 104 may be exposed by a wet etch process to form the round-like exposed surface 104S. The exposed surface of the sacrificial layer 104 located on the side wall of the vertical channel hole 105 may be etched by the wet etch process.

The exposed surfaces of the first porous layer 104L, the non-porous layer 104M and the second porous layer 104U may be horizontally etched to form the round-like exposed surface 104S. During the wet etch process, the first and second porous layers 104L and 104U may be etched more rapidly than the non-porous layer 104M. Accordingly, while the exposed surface of the non-porous layer 104M is etched, the exposed surfaces of the first and second porous layers 104L and 104U may be rapidly etched.

As described above, the round-like exposed surface 104S may be formed by the wet etch process, and the edge profile of the residual sacrificial layer 104R may be modified by the round-like exposed surface 104S. The edge profile of the residual sacrificial layer 104R may have a round-like profile.

As illustrated in FIG. 3B, the blocking layer 106 may be formed. An oxide deposition process may be performed to form the blocking layer 106. In some embodiments, an oxidation process may be performed to form the blocking layer 106. The side wall of the vertical channel hole 105 may be covered by the blocking layer 106 through the oxidation process or the oxide deposition process.

The blocking layer 106 may cover the side wall of the vertical channel hole 105. The blocking layer 106 may include the covering blocking layer 106V and the protruding blocking layer 106L. The protruding blocking layer 106L may extend horizontally from the covering blocking layer 106V. The protruding blocking layer 106L and the covering blocking layer 106V may include silicon oxide. The protruding blocking layer 106L may include the interface portions 106I and the middle portion 106M between the interface portions 106I. The interface portions 106I may contact the edges of the first and second porous layers 104L and 104U, and the middle portion 106M may contact the edge of the non-porous layer 104M. The interface portions 106I may contact the dielectric layer 103 as well.

As described above, the edge profile of the residual sacrificial layer 104R may be modified by the wet etch process and the protruding blocking layer 106L. The edge profile of the residual sacrificial layer 104R may have a round-like profile.

The edge of the residual sacrificial layer 104R may have the round-like profile. The edge of the residual sacrificial layer 104R may have a positive profile that is covered by the protruding blocking layer 106L. The surface of the protruding blocking layer 106L may have the round-like profile, and the rounded surface of the protruding blocking layer 106L may contact the edge of the residual sacrificial layer 104R.

Subsequently, a series of processes illustrated in FIGS. 2E to 2H may be performed.

Figure 4:
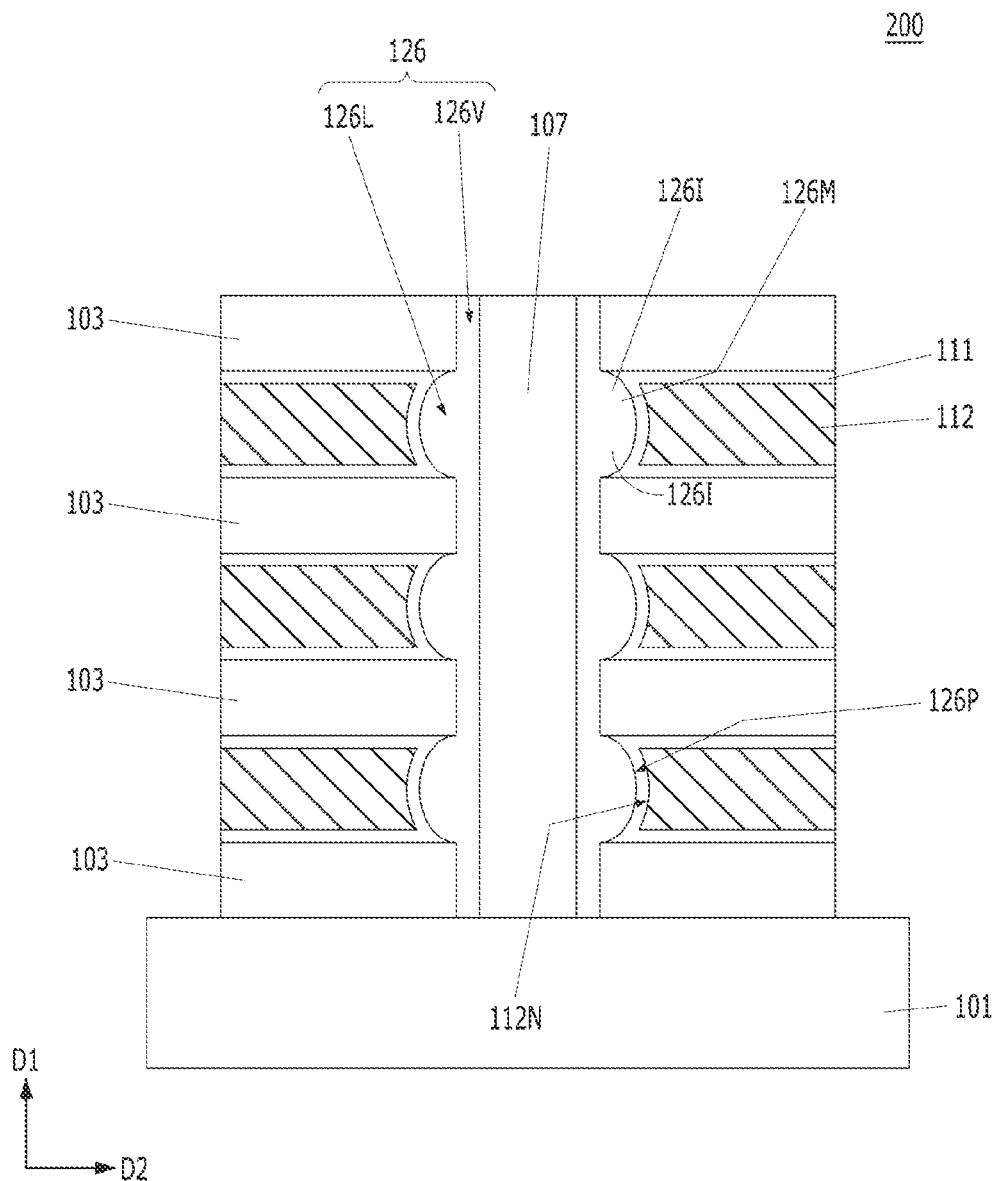
FIG. 4 is a diagram illustrating a vertical memory device in accordance with an embodiment.

FIG. 4 is a diagram illustrating a vertical memory device 200 in accordance with an embodiment.

Referring to FIG. 4, the vertical memory device 200 may include a substrate 101, a vertical channel structure 107 formed on the substrate 101 and an alternating stack surrounding the vertical channel structure 107. The alternating stack may have a structure in which a plurality of gate structures 112 and a plurality of dielectric layers 103 are alternately stacked. The gate structures 112 and the dielectric layers 103 may be alternately stacked along a first direction D1 perpendicular to the surface of the substrate 101. The vertical channel structure 107 may penetrate the alternating stack.

The vertical channel structure 107 may vertically extend in the first direction D1 on the substrate 101. The vertical channel structure 107 may be formed in a vertical channel hole (reference numeral omitted, refer to reference numeral '105' of FIG. 1A) penetrating the alternating stack. A blocking layer 126 and a liner blocking layer 111 may be formed to surround the outer wall of the vertical channel structure 107. Each of the gate structures 112 may be provided between the plurality of dielectric layers 103. The gate structure 112 may extend in a second direction D2 parallel to the surface of the substrate 101. The vertical channel structure 107 may be substantially the same as the vertical channel structure 107 of FIG. 1A.

As illustrated in FIG. 4, the blocking layer 126 may include a covering blocking layer 126V and a protruding blocking layer 126L. The protruding blocking layer 126L may extend horizontally from the covering blocking layer 126V. The protruding blocking layer 126L may have a positive profile 126P. In other words, the protruding blocking layer 126L may have a surface protruding in an edge direction of the gate structure 112. The protruding blocking layer 126L may include interface portions 126I and a middle portion 126M between the interface portions 126I. The interface portions 126I may contact the dielectric layers 103.

The protruding blocking layer 126L may include silicon oxynitride. The covering blocking layer 106V may include silicon oxide.

As described above, the protruding blocking layer 126L may be non-conformally formed. The edge profile of the gate structure 112 may be modified by the protruding blocking layer 126L. The edge profile of the gate structure 112 may have a round-like profile.

The round-like edge of the gate structure 112 may have a negative profile 112N that is covered by the protruding blocking layer 126L. The surface of the protruding blocking layer 126L may have the round-like profile, and the rounded surface of the protruding blocking layer 126L may contact the round-like edge of the gate structure 112.

FIG. 5A to 5G are diagrams for describing an example of a method for fabricating the vertical memory device 200 illustrated in FIG. 4.

Figure 5A:
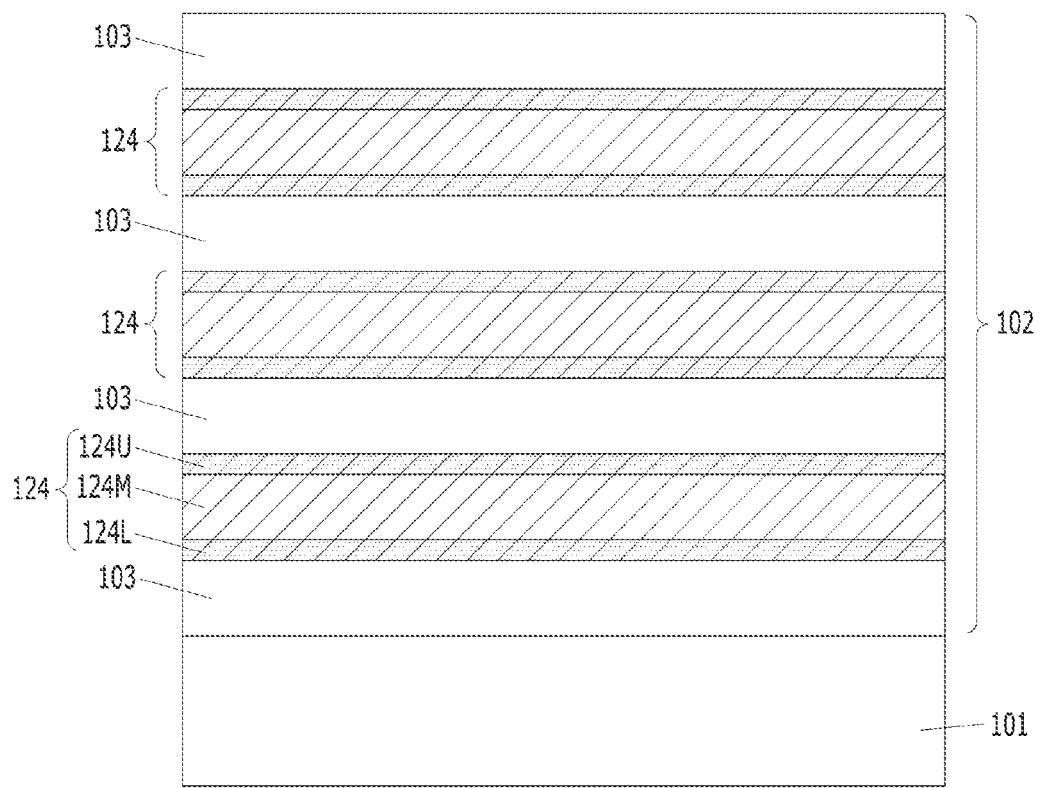
FIG. 5A to 5G are diagrams for describing an example of a method for fabricating the vertical memory device illustrated in FIG. 4.

As illustrated FIG. 5A, a stack structure 102 may be formed on the substrate 101. The substrate 101 may be a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 101 may include another semiconductor material, such as germanium. The substrate 101 may include an III/V-group semiconductor substrate, for example, a chemical compound semiconductor substrate such as a gallium arsenide (GaAs). The substrate 101 may include a Silicon-On-Insulator (SOI) substrate.

The stack structure 102 may include an alternating stack of the dielectric layer 103 and a sacrificial layer 124. For example, the alternating stack may have a structure in which the dielectric layer 103 and the sacrificial layer 124 are alternately stacked. Each of the dielectric layer 103 and the sacrificial layer 124 may be formed of a plurality of layers.

The sacrificial layer 124 may include a combination of porous and non-porous materials. For example, the sacrificial layer 124 may have a multilayered structure including a first non-porous layer 124L, a porous layer 124M and a second non-porous layer 124U. The first and second non-porous layers 124L and 124U may be the same material. The porous layer 124M may be a different material from the first and second non-porous layers 124L and 124U. The porous layer 124M may have a larger thickness than the first and second non-porous layers 124L and 124U. The first and second non-porous layers 124L and 124U may include a non-porous material, and the porous layer 124M may include a porous material.

The first and second non-porous layers 124L and 124U may include a material having a lower oxidation rate than the porous layer 124M.

The first and second non-porous layers 124L and 124U and the porous layer 124M may be nitride-based materials. The first and second non-porous layers 124L and 124U may be a non-porous nitride, and the porous layer 124M may be a porous nitride. In an embodiment, the first and second non-porous layers 124L and 124U may be non-porous silicon nitride, and the porous layer 124M may be a porous silicon nitride. Each of the first and second non-porous layers 124L and 124U may directly contact the dielectric layer 103, and the porous layer 124M might not contact the dielectric layer 103.

Figure 5B:
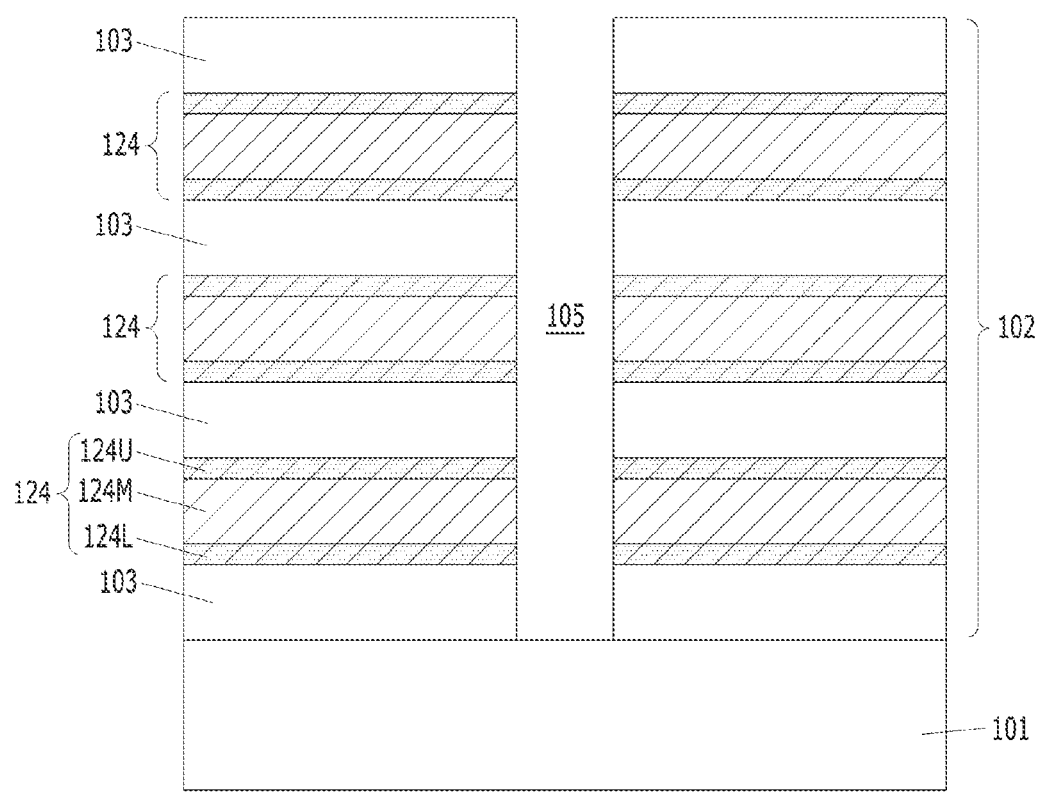

As illustrated in FIG. 5B, a vertical channel hole 105 may be formed in the stack structure 102.

The side wall of the vertical channel hole 105 may be provided by the dielectric layer 103 and the sacrificial layer 124. A part of the side wall of the vertical channel hole 105 may be provided by the first and second non-porous layers 124L and 124U and the porous layer 124M. In other words, parts of the first and second non-porous layers 124L and 124U and the porous layer 124M may be exposed by the vertical channel hole 105.

Figure 5C:
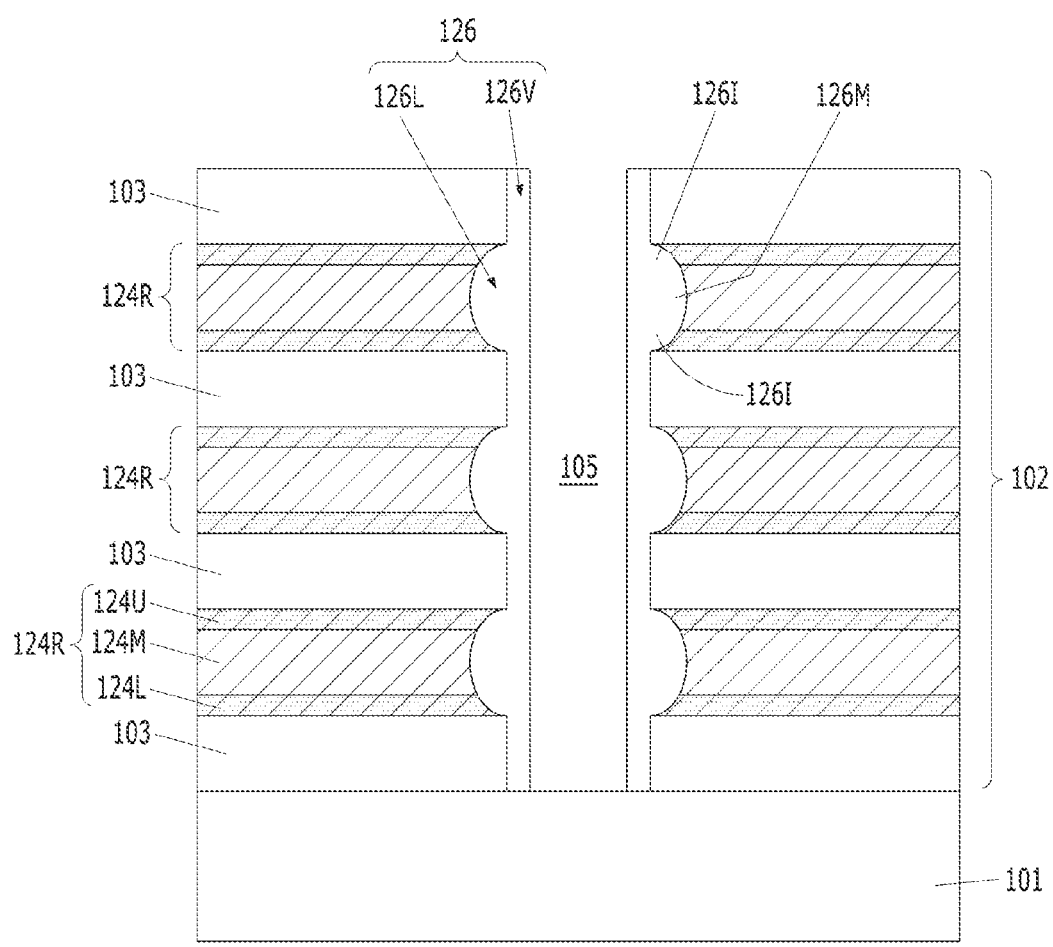

As illustrated in FIG. 5C, the blocking layer 126 may be formed. An oxidation process may be performed to form the blocking layer 126. The side wall of the vertical channel hole 105 may be converted into the blocking layer 126 by the oxidation process. Exposed surfaces of the sacrificial layer 124 located on the side wall of the vertical channel hole 105 may be oxidized by the oxidation process.

The blocking layer 126 may include the covering blocking layer 126V and the protruding blocking layer 126L. The covering blocking layer 126V may be formed by oxidizing the exposed surfaces of the dielectric layer 103. The protruding blocking layer 126L may be formed by laterally oxidizing exposed surfaces of the first and second non-porous layers 124L and 124U and the porous layer 124M. The covering blocking layer 126V may have a uniform thickness. The protruding blocking layer 126L may have a non-uniform thickness.

The blocking layer 126 may cover the side wall of the vertical channel hole 105. The protruding blocking layer 126L may extend horizontally from the covering blocking layer 126V.

The protruding blocking layer 126L may include the interface portions 126I and the middle portion 126M between the interface portions 126I.

The interface portions 126I may be formed by edge oxidation of the first and second non-porous layers 124L and 124U. The middle portion 126M may be formed by edge oxidation of the porous layer 124M. The interface portions 106I may contact the dielectric layer 103.

During the oxidation process, the first and second non-porous layers 124L and 124U may be oxidized slower than the porous layer 124M. Thus, the exposed surfaces of the first and second non-porous layers 124L and 124U may be oxidized slowly while the exposed surface of the porous layer 124M is oxidized. When the first non-porous layer 124L, the porous layer 124M and the second non-porous layer 124U include silicon nitride, the protruding blocking layer 126L may include silicon oxynitride. The covering blocking layer 126V may include silicon oxide.

As described above, the protruding blocking layer 126L may be formed by the oxidation process, and be non-conformally formed. The edge profile of the sacrificial layer 124 may be modified by the protruding blocking layer 126L. The edge profile of the sacrificial layer 124 may have a round-like profile.

As the protruding blocking layer 126L is formed, the edge of a residual sacrificial layer 124R may have a round-like profile. The edge of the residual sacrificial layer 124R may have a positive profile that is covered by the protruding blocking layer 126L. The surface of the protruding blocking layer 126L may have a round-like profile, and the rounded surface of the protruding blocking layer 126L may contact the edge of the residual sacrificial layer 124R.

Figure 5D:
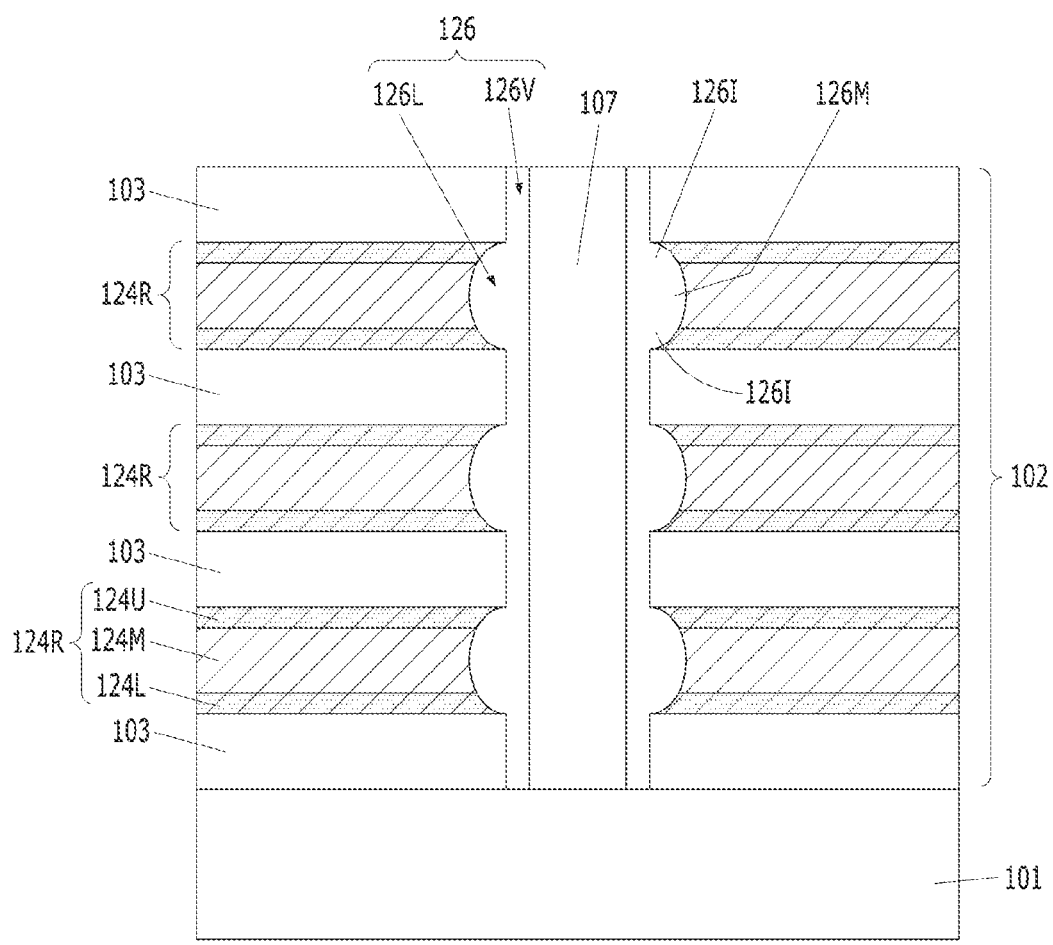

As illustrated in FIG. 5D, the vertical channel structure 107 may be formed. The vertical channel structure 107 may extend vertically from the surface of the substrate 101. The vertical channel structure 107 may fill the vertical channel hole 105. The blocking layer 126 may have a shape of surrounding the outer wall of the vertical channel structure 107.

Figure 5E:
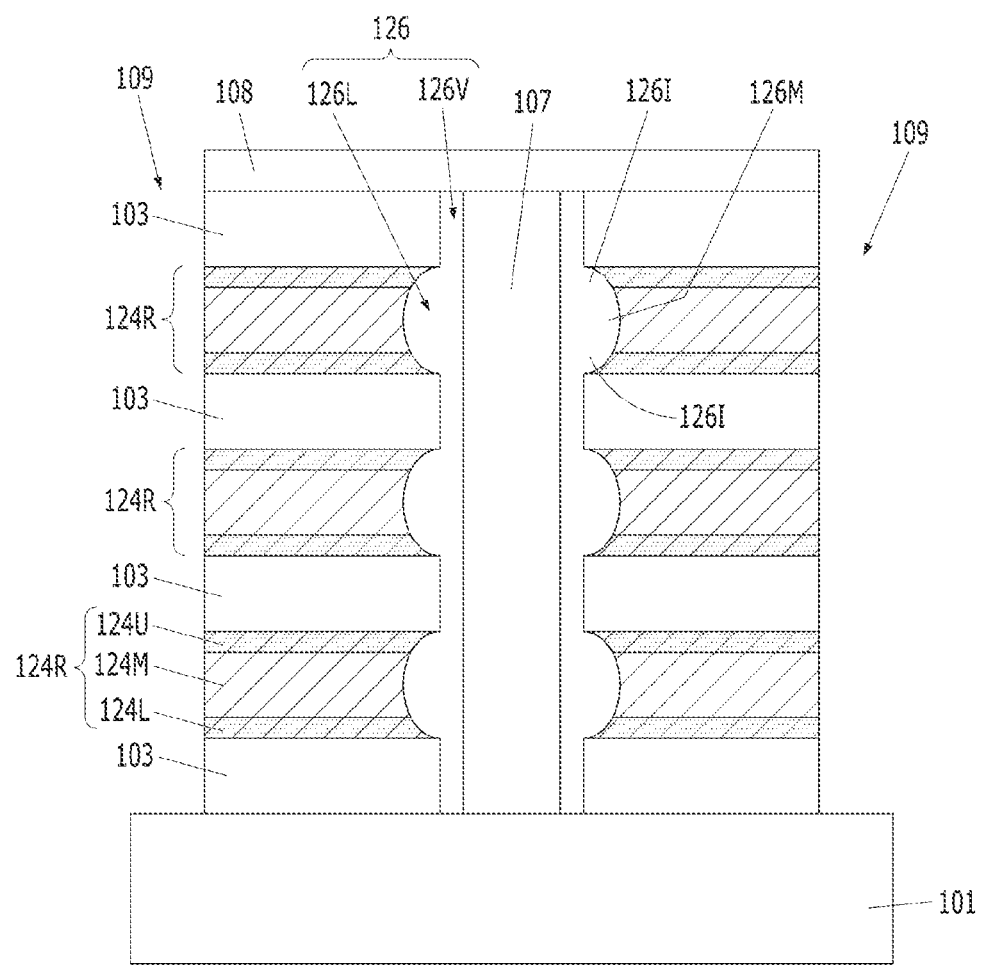

As illustrated in FIG. 5E, an isolation recess 109 may be formed. Another part of the stack structure 102 may be etched using a hard mask layer 108 in order to form the isolation recess 109. The isolation recess 109 may extend vertically from the surface of the substrate 101. From a top view, the isolation recess 109 may have a line shape. The isolation recess 109 may be referred to as a "slit" or a "trench".

Figure 5F:
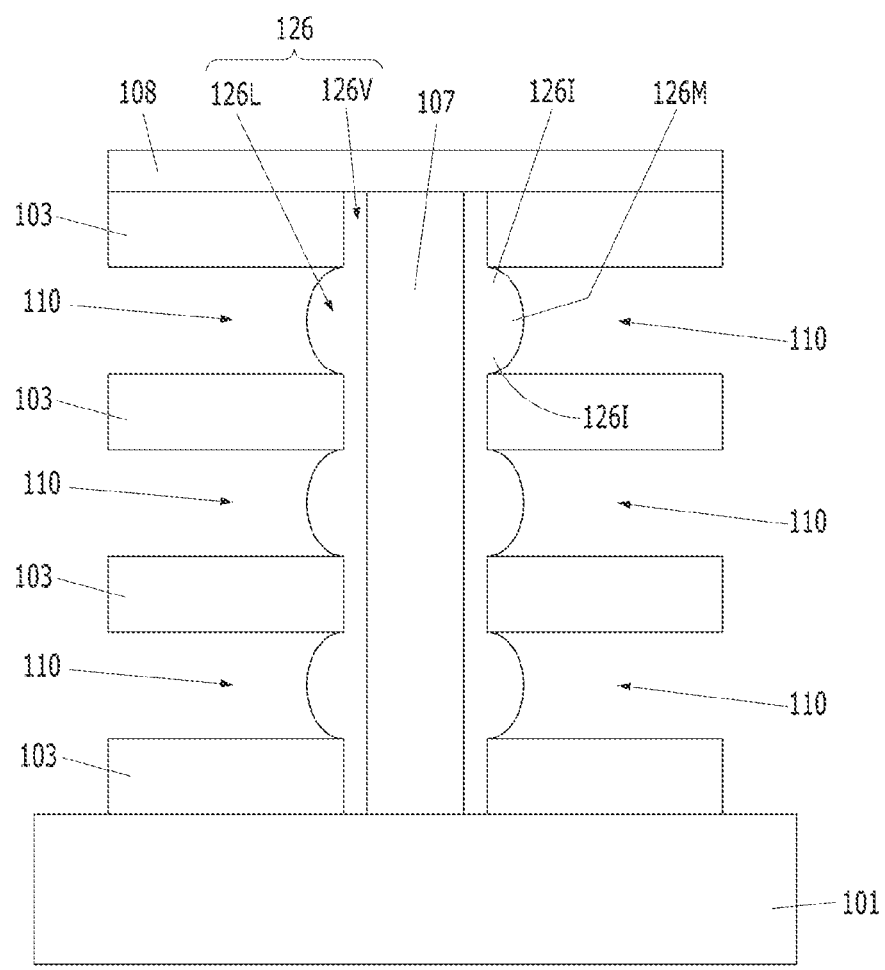

As illustrated in FIG. 5F, a horizontal recess 110 may be formed. The residual sacrificial layer 124R may be removed to form the horizontal recess 110. Accordingly, the horizontal recess 110 may be formed between the neighboring dielectric layers 103. The horizontal recess 110 may have a shape of surrounding the side walls of the vertical channel structure 107 and the protruding blocking layer 126L. One end of the horizontal recess 110 may expose the rounded surface of the protruding blocking layer 126L.

The horizontal recess 110 may extend in a direction parallel to the surface of the substrate 101. The horizontal recess 110 may have a high aspect ratio of height H to depth W of 1:5 or more. The horizontal recess 110 may have a high aspect ratio parallel to the surface of the substrate 101.

The inner edge profile of the horizontal recess 110 may have a round-like profile. The round-like profile may be provided by the surface of the protruding blocking layer 126L.

Figure 5G:
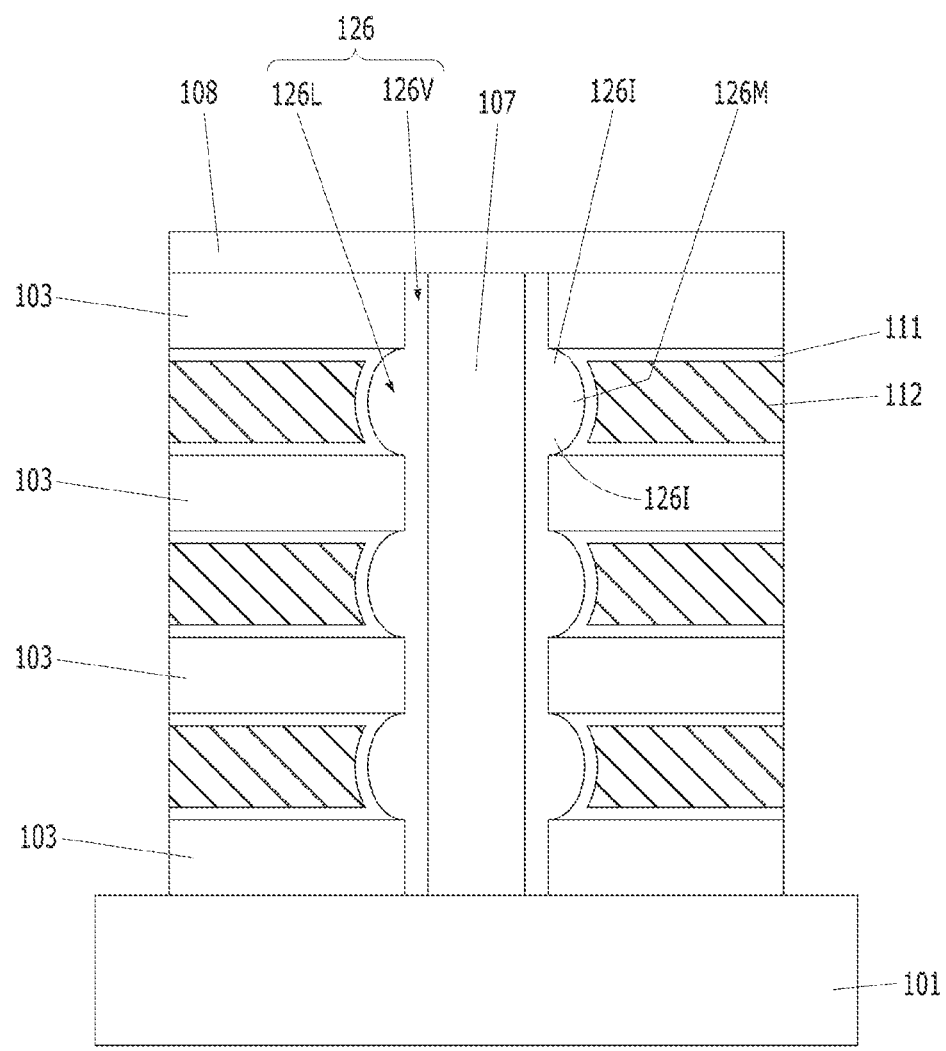

As illustrated in FIG. 5G, the horizontal recess 110 may be filled with the liner blocking layer 111 and the gate structure 112. The methods for forming the liner blocking layer 111 and the gate structure 112 may be substantially the same as those illustrated in FIGS. 2F and 2G.

Figure 6A:
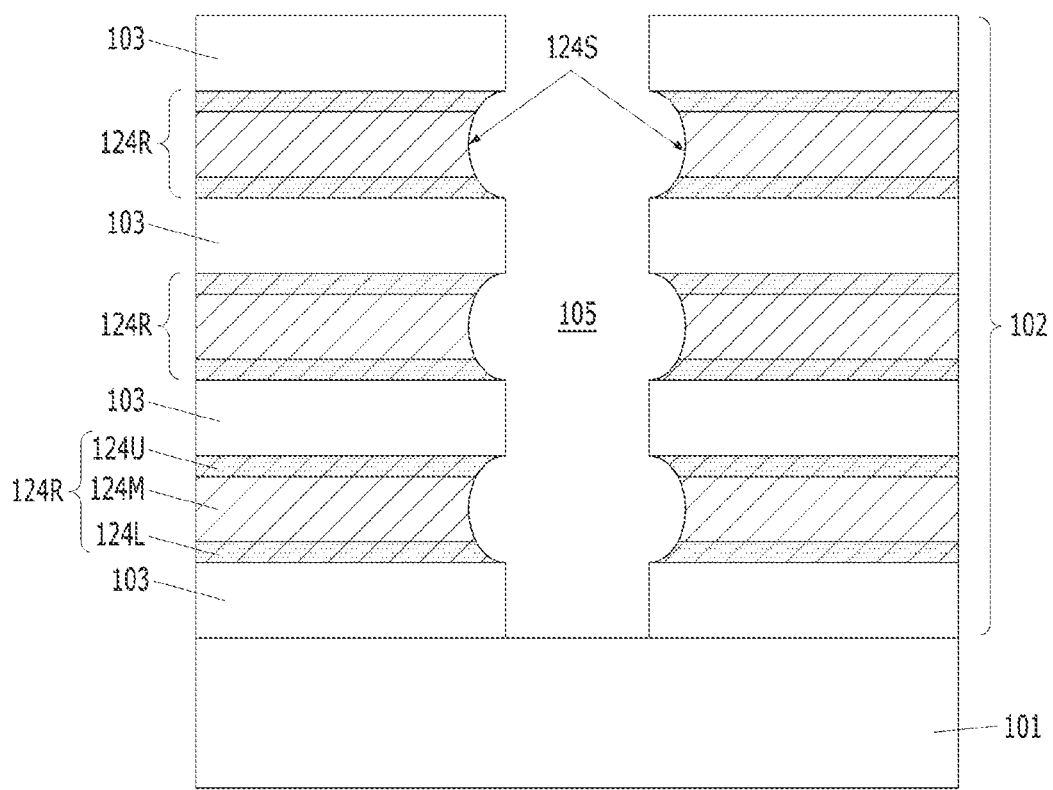
FIGS. 6A and 6B are diagrams for describing another example of a method for fabricating the vertical memory device illustrated in FIG. 4.
Figure 6B:
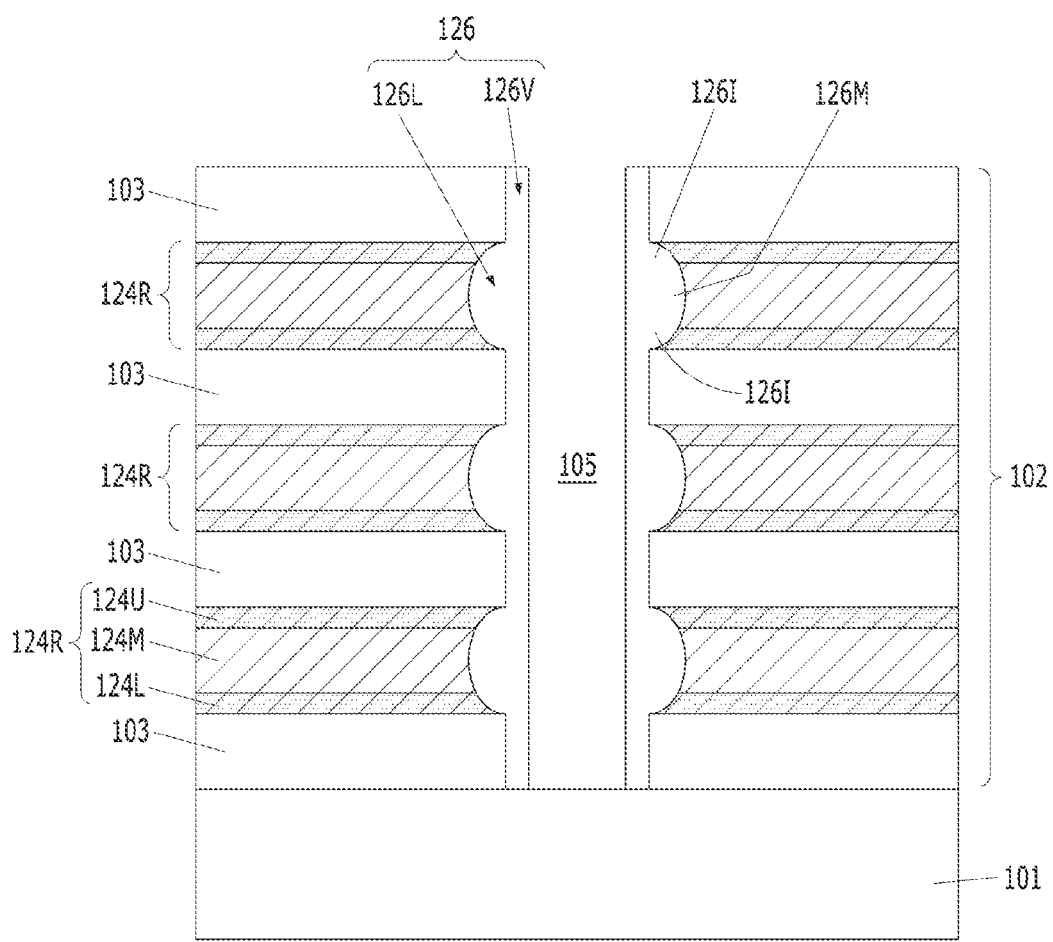

FIGS. 6A and 6B are diagrams for describing another example of a method for fabricating the vertical memory device 200 illustrated in FIG. 4.

As illustrated in FIG. 5A, the stack structure 102 may be formed on the substrate 101. The stack structure 102 may include an alternating stack of the dielectric layer 103 and a sacrificial layer 124. For example, the alternating stack may have a structure in which the dielectric layer 103 and the sacrificial layer 124 are alternately stacked. Each of the dielectric layer 103 and the sacrificial layer 124 may be formed of a plurality of layers.

The sacrificial layer 124 may include a combination of porous and non-porous materials. For example, the sacrificial layer 124 may have a multilayered structure including a first non-porous layer 124L, a porous layer 124M and a second non-porous layer 124U. The first and second non-porous layers 124L and 124U may be the same material. The porous layer 124M may be a different material from the first and second non-porous layers 124L and 124U. The porous layer 124M may have a larger thickness than the first and second non-porous layers 124L and 124U. The first and second non-porous layers 124L and 124U may include a non-porous material, and the porous layer 124M may include a porous material.

The first and second non-porous layers 124L and 124U may include a material having a lower oxidation rate than the porous layer 124M.

The first and second non-porous layers 124L and 124U and the porous layer 124M may be nitride-based materials. The first and second non-porous layers 124L and 124U may be non-porous nitride, and the porous layer 124M may be porous nitride. Each of the first and second non-porous layers 124L and 124U may directly contact the dielectric layer 103, and the porous layer 124M might not contact the dielectric layer 103.

As illustrated in FIG. 5B, the vertical channel hole 105 may be formed in the stack structure 102.

The side wall of the vertical channel hole 105 may be provided by the dielectric layer 103 and the sacrificial layer 124. A part of the side wall of the vertical channel hole 105 may be provided by the first and second non-porous layers 124L and 124U and the porous layer 124M. In other words, parts of the first and second non-porous layers 124L and 124U and the porous layer 124M may be exposed by the vertical channel hole 105.

Subsequently, as illustrated in FIG. 6A, a vertical exposed surface of the sacrificial layer 124 located on the side wall of the vertical channel hole 105 may be recessed to a round-like exposed surface 124S. The sacrificial layer 124 may be exposed by a wet etch process to form the round-like exposed surface 124S. The exposed surface of the sacrificial layer 124 located on the side wall of the vertical channel hole 105 may be etched by the wet etch process. Accordingly, a residual sacrificial layer 124R may have the round-like exposed surface 124S.

The exposed surfaces of the first non-porous layer 124L, the porous layer 124M and the second non-porous layer 124U may be horizontally etched to from the round-like exposed surface 124S. During the wet etch process, the first and second non-porous layers 124L and 124U may be etched slower than the porous layer 124M. Accordingly, while the exposed surface of the porous layer 124M is etched, the exposed surfaces of the first and second non-porous layers 124L and 124U may be etched slowly.

As described above, the round-like exposed surface 124S may be formed by the wet etch process, and the edge profile of the residual sacrificial layer 124R may be modified by the round-like exposed surface 124S. The edge profile of the residual sacrificial layer 124R may have a round-like profile.

As illustrated in FIG. 6B, the blocking layer 126 may be formed. An oxide deposition process may be performed to form the blocking layer 126. The side wall of the vertical channel hole 105 may be covered by the blocking layer 126 by the oxide deposition process. In some embodiment, an oxidation process may be performed to form the blocking layer 126.

The blocking layer 126 may cover the side wall of the vertical channel hole 105. The blocking layer 126 may include the covering blocking layer 126V and the protruding blocking layer 126L. The protruding blocking layer 126L may extend horizontally from the covering blocking layer 126V.

The protruding blocking layer 126L may include the interface portions 126I and the middle portion 126M between the interface portions 126I. The interface portions 126I may contact the dielectric layer 103. The protruding blocking layer 126L may include silicon oxynitride. The covering blocking layer 126V may include silicon oxide. In some embodiments, the protruding blocking layer 126L and the covering blocking layer 126V may include silicon oxide.

As described above, the edge profile of the residual sacrificial layer 124R may be modified by the wet etch process and the protruding blocking layer 126L. The edge profile of the residual sacrificial layer 124R may have a round-like profile.

An edge of the residual sacrificial layer 124R may have the round-like profile. The edge of the residual sacrificial layer 124R may have a positive profile that is covered by the protruding blocking layer 126L. The surface of the protruding blocking layer 126L may have the round-like profile, and the rounded surface of the protruding blocking layer 126L may contact the edge of the sacrificial layer 124.

Subsequently, a series of processes illustrated in FIGS. 5E to 5G may be performed.

Although it is described in the embodiments that the sacrificial layers 104 and 124 are combinations of porous and non-porous materials, the sacrificial layers 104 and 124 may be formed of silicon nitride in which a silicon atom content and a nitrogen atom content are adjusted, in some embodiments. For example, a stack of silicon-rich silicon nitride and nitrogen-rich silicon nitride may be applied to have the difference in oxidation rates and the difference in wet etch rates. The silicon-rich silicon nitride may have a higher oxidation rate than the nitrogen-rich silicon nitride. In addition, the silicon-rich silicon nitride may have a higher wet etch rate than the nitrogen-rich silicon nitride.

Although it is described in the embodiments that the oxidation process is performed to form the blocking layer 106, the blocking layer 106 may be formed by deposition and oxidation processes of a silicon-containing material, in some embodiments. For example, after the vertical channel hole 105 is formed, a silicon layer may be deposited on the vertical channel hole 105, and subsequently the oxidation process may be performed to convert the silicon layer to silicon oxide. In such a process of converting the silicon oxide, the edge of the sacrificial layer 104 may be selectively oxidized, and the protruding blocking layer 106L may be formed.

According to the embodiments, the edge profile of the gate structure may be formed in a negative manner, thereby reinforcing the edge-side electric field of the gate structure and improving erase and program characteristics.

According to the embodiments, the edge profile of the gate structure may be formed in a positive manner, thereby improving disturbance and Z-interference.

While the present embodiments have been described with respect to the specific embodiments, it should be noted that the embodiments are for describing, not limiting, the present embodiments. Further, it should be noted that the present embodiments may be achieved in various ways through substitution, change, and modification, by those skilled in the art without departing from the scope of the present disclosure as defined by the following claims.

What is claimed is:

1. A memory device comprising:
   an alternating stack of conductive layers and dielectric layers located over a substrate;
   a vertical channel structure that penetrates the alternating stack;
   a covering blocking layer that surrounds an outer wall of the vertical channel structure; and
   a protruding blocking layer that extends from the covering blocking layer and contacts edges of the conductive layers,
      wherein each of the conductive layers comprises a round-like edge contacting the protruding blocking layer,
      wherein the protruding blocking layer contacts the dielectric layers, and comprises interface portions having cusp shapes and a middle portion between the interface portions, and
      wherein each of the interface portions comprises oxide of porous nitride.

2. The memory device of claim 1, wherein the protruding blocking layer has a rounded recessing surface contacting the round-like edge of the conductive layer.

3. The memory device of claim 1, wherein the middle portion comprises oxide of non-porous nitride.

4. A memory device comprising:
   an alternating stack of conductive layers and dielectric layers located over a substrate;
   a vertical channel structure that penetrates the alternating stack;
   a covering blocking layer that surrounds an outer wall of the vertical channel structure; and
   a protruding blocking layer that extends from the covering blocking layer and contacts edges of the conductive layers,
      wherein each of the conductive layers comprises a round-like edge contacting the protruding blocking layer,
      wherein the protruding blocking layer has a rounded protruding surface,
      wherein the protruding blocking layer comprises interface portions contacting the dielectric layers and a middle portion between the interface portions, and
      wherein each of the interface portions comprises oxide of non-porous nitride.

5. The memory device of claim 4, wherein the middle portion comprises oxide of porous nitride.

6. The memory device of claim 1, wherein each of the covering blocking layer and the protruding blocking layer comprises silicon oxide.

7. The memory device of claim 1, wherein the covering blocking layer comprises silicon oxide, and the protruding blocking layer comprises silicon oxynitride.

* * * * *